(12) United States Patent
Xiong et al.

(10) Patent No.: US 10,573,794 B2
(45) Date of Patent: Feb. 25, 2020

(54) METHOD OF PACKAGING CSP LED AND CSP LED

(71) Applicant: Hongli Zhihui Group Co.,Ltd., Guangdong (CN)

(72) Inventors: Yi Xiong, Guangdong (CN); Yuefei Wang, Guangdong (CN); Tiangang Lv, Guangdong (CN); Kunzhui Li, Guangdong (CN); Guoping Li, Guangdong (CN)

(73) Assignee: Hongli Zhihui Group Co.,Ltd., Guangdong (CN)

( * ) Notice: Subject to any disclaimer, the term of this patent is extended or adjusted under 35 U.S.C. 154(b) by 17 days.

(21) Appl. No.: 15/535,709

(22) PCT Filed: Mar. 31, 2016

(86) PCT No.: PCT/CN2016/077939
§ 371 (c)(1),
(2) Date: Jun. 14, 2017

(87) PCT Pub. No.: WO2016/192452
PCT Pub. Date: Dec. 8, 2016

(65) Prior Publication Data
US 2018/0277725 A1    Sep. 27, 2018

(30) Foreign Application Priority Data

May 29, 2015 (CN) .......................... 2015 1 0286106
Jul. 29, 2015 (CN) .......................... 2015 1 0453411
(Continued)

(51) Int. Cl.
*H01L 33/60* (2010.01)
*H01L 33/50* (2010.01)
(Continued)

(52) U.S. Cl.
CPC ............ *H01L 33/60* (2013.01); *H01L 33/486* (2013.01); *H01L 33/502* (2013.01); *H01L 33/50* (2013.01);
(Continued)

(58) Field of Classification Search
CPC ...................................................... H01L 33/52
See application file for complete search history.

(56) References Cited

U.S. PATENT DOCUMENTS

2006/0001055 A1* 1/2006 Ueno .................... H01L 33/486
257/257
2007/0090387 A1* 4/2007 Daniels ................... H01L 24/75
257/99
(Continued)

FOREIGN PATENT DOCUMENTS

| CN | 104112810 | 10/2014 |
|----|-----------|---------|
| CN | 104253194 | 12/2014 |

(Continued)

OTHER PUBLICATIONS

"International Search Report (Form PCT/ISA/210)", dated Jul. 6, 2016, with English translation thereof, pp. 1-6.

*Primary Examiner* — Moazzam Hossain
*Assistant Examiner* — Omar F Mojaddedi
(74) *Attorney, Agent, or Firm* — JCIPRNET

(57) ABSTRACT

A method of packaging CSP LED, comprising the following steps: placing LED chips on a carrier plate; coating light-blocking glue or fluorescent glue on the LED chips; at last cutting to form CSP LEDs with coating light-blocking glue or fluorescent glue outside the chip. Multiple LEDs with one light-emitting surface could be fabricated simultaneously. The process is simple and can prevent yellow light from appearing at the bonding surface of the light-blocking glue and the chip. The invention provides a CPS LED with the chip covered by packaging glue and the electrode of the chip protruding exposed and protruding. The invention provides CPS LED with three light-emitting surfaces and light-blocking glue arranged on two side surfaces and fluorescent glue arranged on other surfaces. This kind of LED could be
(Continued)

used in various fields such as backlight and light bar, from side surfaces of which light could be emitted.

11 Claims, 14 Drawing Sheets

(30) Foreign Application Priority Data

| Jul. 29, 2015 | (CN) | .......................... 2015 1 0453561 |
| Jul. 29, 2015 | (CN) | ..................... 2015 2 0557612 U |
| Aug. 6, 2015 | (CN) | .......................... 2015 1 0476096 |
| Nov. 13, 2015 | (CN) | ..................... 2015 2 0904004 U |

(51) Int. Cl.
 *H01L 33/48* (2010.01)
 *H01L 33/52* (2010.01)
(52) U.S. Cl.
 CPC ...... *H01L 33/52* (2013.01); *H01L 2933/0033* (2013.01); *H01L 2933/0041* (2013.01); *H01L 2933/0058* (2013.01)

(56) References Cited

U.S. PATENT DOCUMENTS

| 2012/0302124 | A1* | 11/2012 | Imazu | ................... H01L 33/486 445/58 |
| 2012/0305969 | A1* | 12/2012 | Sato | ........................ H01L 33/60 257/98 |
| 2015/0200338 | A1* | 7/2015 | Kim | ........................ H01L 33/44 257/88 |
| 2015/0228869 | A1* | 8/2015 | Yoo | ........................ H01L 33/54 362/97.3 |

FOREIGN PATENT DOCUMENTS

| CN | 105006510 | 10/2015 |
| CN | 105006511 | 10/2015 |
| CN | 105006512 | 10/2015 |
| CN | 105047786 | 11/2015 |
| CN | 204857775 | 12/2015 |
| JP | 2013140894 | 7/2013 |
| WO | 2014091914 | 6/2014 |
| WO | 2014185693 | 11/2014 |

\* cited by examiner

METHOD OF PACKAGING CSP LED AND CSP LED

CROSS-REFERENCE TO RELATED APPLICATION

This application is a 371 application of an International PCT application serial no. PCT/CN2016/077939, filed on Mar. 31, 2016, which claims the priority benefits of China Application No. 201510286106.7, filed on May 29, 2015, China Application No. 201520557612.0, filed on Jul. 29, 2015, China Application No. 201510453411.0, filed on Jul. 29, 2015, China Application No. 201510453561.1, filed on Jul. 29, 2015, China Application No. 201510476096.3, filed on Aug. 6, 2015 and China Application No. 201520904004.2, filed on Nov. 13, 2015. The entirety of each of the above-mentioned patent applications is hereby incorporated by reference herein and made a part of this specification.

TECHNICAL FIELD

The present invention relates to LED packaging, particularly to method of packaging white light LED.

BACKGROUND

The new Chip Scale Package LED (CSP LED) based on flip chip is a LED that packages the packaging glue onto the top surface and side surfaces of chips on the bottom surface of which electrode are arranged, so that the electrode could be exposed. The packaging cost can be reduced by this packaging structure without bracket or substrate. In general, five light-emitting surfaces are utilized in existing CSP LEDs, that is, light can be emitted from the top surface and four side surfaces of a LED, and the packaging process of this kind of LED is relatively simple. With the improvement of people's demand for angle and consistency of light emitted, the structure of existing CSP LEDs can't meet the demand of people, the emergence of a CSP LED with a single light-emitting surface is desired. A packaging structure of CSP LED disclosed in Chinese Patent No. CN104112810A comprising a LED chip and packaging glue packaged on the top surface and side surfaces of the LED chip, an electrode is arranged on the bottom surface of the LED chip, a reflector is arranged on at least one of the following parts of the packaging glue: bottom surface and side surfaces. The reflector is a reflecting surface or reflecting plane extending from the bottom surface of the self-packaging glue to side surfaces. Light extraction efficiency could be improved and angle of light emitted by spraying a reflecting layer on the bottom surface and side surfaces of the self-packaging colloid, and a single light-emitting surface can be formed. Although a single light-emitting surface can be achieved for a product by this approach, packaging process is complicated. Since the reflector for blocking light is formed through spraying, for such process only could be performed on a single LED, efforts and resources consumed by this process would be undoubtedly enormous, which causes it's not suitable for large-scale production.

Covering fluorescent glue onto the surface of a LED chip is the main process in the packaging process of CSP LED; however, a fluorescent glue layer is usually formed by molding or printing in existing fluorescent glue covering process. The low LED production efficiency is mainly because the complicated fluorescent glue forming processes.

Existing making process of single CSP without a substrate is that: first, laying film on a machine, then placing multiple chips on the film followed by packaging the fluorescent glue on the film, and solidifying the fluorescent glue to coat chips except the bottom surface with the fluorescent glue, cutting the chip groups formed into single CSPs.

During cutting, there may be some downward burrs formed on the lower edge of the fluorescent glue layer which causes rugged phenomenon between the fluorescent layer and the bottom of the chips. When the CSP is packaged on a flat substrate, the existence of the burrs makes it difficult for the chips to closely contact with the substrate, thus the reliability of the electrical connection may be affected.

Currently, the connection between the CSPs and the substrate is achieved by placing solder paste and flux onto the substrate, and then applying solder reflow. The plane on which the fluorescent glue layer and the bottom surface of the chips are may be rugged due to the expansion of the fluorescent glue layer during heating, this will result in the occurrence of loose contact, void contact of even no contact when the chips are bonded to the pads on the substrate, the reliability of the electrical connection between the chips and the substrate may be affected.

In view of the technical problems mentioned above, a special structure of flip chip is applied by the inventor. The inventor believes that if the flip chip electrode and the packaging glue form a step, these technical problems may be solved by forming a step with electrode of the flip chip and fluorescent glue. However, it's difficult to form a step between the electrode and fluorescent glue during packaging, because the fluorescent glue is fluid before solidification in fabricating CSP chip. This creates a bottleneck in fabricating.

For side-emitting light source module such as panel light, backlight module and so on, usually light emitting device such as a light bar is fixed on the side of the side-emitting light source module by a lamp, so that light usually emitted from side surface and exported by some optical device.

In view of the light source module mentioned above, existing ordinary light emitting devices are mainly used at present, for example a light emitting device composed of a chip and fluorescent glue, a light emitting device composed of a chip, a bracket, and fluorescent glue. In general, there should be multiple light emitting devices placed on the substrate to form a light source. As shown in FIG. 22, for a light emitting device 100a composed of a chip and fluorescent glue, the chip may usually have light emitting angle of its own, there will be a dark area 300a between two light emitting devices after the light emitting device 100a is mounted on the substrate 300, since the light emitting angle of the chip is relatively small, there may be a dark area 300a between tow light emitting devices which might influence the consistency of light emitted. Also, the light bar is fixed to the side surface of the light source by a clamp, there may be a certain degree of blocking caused by the clamp to the light emitting device, so light emitted from part of the light emitting device corresponding to the clamp may be wasted. In addition, the light emitting device emits light to all around, but only light along the direction of the length of the substrate and light from the top surface could be used, the rest could not be used well, which causes a lower light utilization.

Similarly, there will be problems mentioned above as well if a light emitting device composed of a chip, a bracket, and fluorescent glue is used.

Nowadays, CSP packaging structure is widely used in various fields because of its small size, light weight and good electrical performance.

Current CSP packaging structure mainly includes a flip chip and packaging glue packaged on the flip chip, the packaging glue is fluorescent glue. Light can be emitted from each surface of the flip chip, if the CSP packaging structure is mounted on a substrate, light can be emitted from each surface except for the bottom surface. However, for a special light source, light emitted from some side surfaces couldn't be used, result in low light utilization.

SUMMARY OF THE INVENTION

The first technical problem to be solved by the present invention is to provide a method of packaging CSP LED of which the process is so simple that a large-scale production could be achieved easily, and the occurrence of a yellow circle around a LED product could be prevented during light emitting.

The second technical problem to be solved by the present invention is to provide a CSP LED having characteristic of that light could be emitted from one surface to compensate for the deficiencies of present technologies.

The third technical problem to be solved by the present invention is to provide a method of packaging Chip Scale Package LED of which the process is so simple that a large-scale production could be achieved easily.

The fourth technical problem to be solved by the present invention is to provide a Chip Scale Package LED, light could be emitted only from its top surface of this structure, and white light could be excited by arranging a fluorescent glue layer on the top surface of the LED chip.

The fifth technical problem to be solved by the present invention is to provide a method of packaging LED, the formation of fluorescent blue layer on the LED chip is so simple that efficiency of LED packaging is improved.

The sixth technical problem to be solved by the present invention is to provide a method of fabricating LED packaging structure to fabricate a LED packaging structure with a step between electrode and packaging glue, to simplify process and to reduce cost.

The seventh technical problem to be solved by the present invention is to provide a LED packaging structure to reduce void rate of the connection between the LED packaging structure and the substrate, to improve reliability of fixation of the LED packaging structure and reliability of electrical connection between the LED packaging structure and the substrate.

The eighth technical problem to be solved by the present invention is to provide a CSP packaging structure, from three surfaces of which light could be emitted, to improve light utilization.

The ninth technical problem to be solved by the present invention is to provide a light bar based on a CSP packaging structure to improve light utilization and to reduce dark area between two CSP packaging structures.

In order to solve the first problem mentioned above, the solution of the present invention is a method of packaging CSP LED, comprising the following steps:

(1) placing a layer of fixed film for fixing the position of LED chips on a carrier plate;

(2) distributing some LED chips on the surface of the fixed film, and the LED chips being of array distribution, there being a space left between adjacent LED chips; an electrode arranged on the bottom surface of the LED chip, and the bottom surface of the LED chip being against the fixed film;

(3) coating a layer of light-blocking glue on the LED chips array, light emitting surface of each LED chip being fully covered by the light-blocking glue;

(4) grinding to remove surface of the light-blocking glue after solidification of the light-blocking glue to expose the top surface of the LED chips, the height of the top surfaces of the LED chips being leveled with that of the light-blocking glue on the side surfaces;

(5) coating a fluorescent glue layer on the top surfaces of the LED chips, and the top surface of the fluorescent glue layer being higher than that of the light-blocking glue on the side surfaces, the top surface of the fluorescent glue and that of the light-blocking glue forming a step;

(6) cutting along the space between adjacent LED chips with a cutting depth up to the fixed film, so that the fluorescent glue layer and the light-blocking glue layer being completely cut off;

(7) separating single LED chips.

Multiple LEDs, from one surface of which light could be emitted, could be fabricated simultaneously through the process of the present invention. The LED, from one surface of which light could be emitted, could be used as a light source for a product with high light emitting requirement.

The advantageous effects of the present invention as compared with the prior art are as following:

In the present invention, multiple LEDs, from one surface of which light could be emitted, could be fabricated simultaneously by using the packaging process that fixing multiple LED chips, brushing light-blocking glue into the space between adjacent LED chips to form light-blocking glue layer on the side surfaces around the LED chips, separating the multiple LED chips at last. The side surfaces of the LED chips are blocked by the light-blocking glue, since amount of blue light emitted from side surfaces of the LED chip is smaller than that of blue light emitted from center of the LED chip, if fluorescent glue is covered on the top surface of the light-blocking glue, a yellow circle may appear after the excitation of blue light emitted from side surfaces of the LED chip through the fluorescent glue around, thereby influencing the effect of light emitting of the LED. A better effect of light emitting of the LED could be achieved in the present invention by cutting to remove peripheral fluorescent glue of the top surface of the LED chip, so that blue light couldn't be excited from side surface of the LED chip. Moreover, the inside of the light-blocking glue layer connected with the LED chip is blocked by the fluorescent glue layer, so that prevent blue light emitting from side surfaces of the LED chip from emitting from the bonding surface of the light-blocking glue layer and side surfaces of the chip to influence total efficiency of the LED chip.

In order to solve the second problem mentioned above, the solution of the present invention is a CSP LED including a LED chip, the LED chip including a semiconductor chip and an electrode arranged on the bottom of the semiconductor chip, the top surface and four side surfaces of the semiconductor chip being light emitting surfaces; light-blocking glue layer blocks and is arranged on all the light emitting surfaces on the four side surfaces of the semiconductor chip, a fluorescent glue layer covers and is arranged on the light emitting surface on the top surface of the semiconductor chip; a step formed by the top surface of the fluorescent glue layer and that of the light-blocking glue layer. By adding a light-blocking glue layer on the side surfaces of the flip LED chip in the present invention, light could be emitted only from top surface rather than four side surfaces of the LED chip. The side surfaces of the LED chip is blocked by the light-blocking glue, since amount of blue light emitted from side surfaces of the LED chip is smaller than that of blue light emitted from center of the LED chip, if fluorescent glue is covered on the top surface of the light-blocking glue, a yellow circle may appear after the excitation of blue light emitted from side surfaces of the LED chip through the fluorescent glue around, thereby influencing the effect of light emitting of LED. A better effect of light emitting of LED could be achieved in the present invention by cutting to remove peripheral fluorescent glue of the top surface of the LED chip, so that blue light emitted from the side surfaces of the LED chip couldn't excite the fluorescent glue.

As an improvement, a light leak proof layer is arranged around the fluorescent glue along the edge of the fluorescent glue layer, the light leak proof layer being on the top of the light-blocking glue layer and blocking the inside of the light-blocking glue layer. The light leak proof layer could prevent blue light emitted from the LED chip from emitting from the bonding surface of the light-blocking glue layer and side surfaces of the chip to influence total efficiency of the LED chip.

As an improvement, the lower end of the fluorescent glue layer is leveled with the bottom of the semiconductor chip. There would be a certain space left between the lower end of the light-blocking glue layer and the substrate when the LED chip die bond is performed, to prevent lack of space for expansion of the light-blocking glue layer during heating from damaging the device.

The advantageous effects of the present invention as compared with the prior art are as following:

By adding a light-blocking glue layer on the side surfaces of the flip LED chip in the present invention, light could be emitted only from top surface rather than four side surfaces of the LED chip. The side surfaces LED chip is blocked by the light-blocking glue, since amount of blue light emitted from side surfaces of the LED chip is smaller than that of blue light emitted from center of the LED chip, if fluorescent glue is covered on the top surface of the light-blocking glue, a yellow circle may appear after the excitation of blue light emitted from side surfaces of the LED chip through the fluorescent glue around, thereby influencing the effect of light emitting of LED. A better effect of light emitting of LED could be achieved in the present invention by cutting to remove peripheral fluorescent glue of the top surface of the LED chip, so that blue light from the side surfaces of the LED chip couldn't excite from the side surfaces of the LED chip. The lower end of the fluorescent glue layer is leveled with the bottom of the semiconductor chip. There would be a certain space left between the lower end of the light-blocking glue layer and the substrate when the LED chip die bond is performed, to prevent lack of space for expansion of the light-blocking glue layer during heating from damaging the device.

In order to solve the third problem mentioned above, the solution of the present invention is a method of packaging Chip Scale Package LED, comprising the following steps:

(1) placing a layer of fixed film for fixing the position of LED chips on a carrier plate;

(2) distributing some LED chips on the surface of the fixed film, and the LED chips being of array distribution, there being a space left between adjacent LED chips;

an electrode arranged on the bottom surface of the LED chip, and the bottom surface of the LED chip being against the fixed film;

(3) coating a layer of fluorescent glue on the LED chips, the space between adjacent LED chips being fully filled with the fluorescent glue, the top surface and four side surfaces of the LED chips being covered by the fluorescent glue;

(4) pasting a layer of protective film on the surface of the fluorescent glue layer after solidification of the fluorescent glue;

(5) cutting at the space between adjacent LED chips and forming a groove between adjacent LED chips, the fluorescent glue layer and the protective film being cut by the groove;

(6) filling the groove with light-blocking glue;

(7) cutting the light-blocking glue layer with a cutting depth up to the fixed film after solidification of the light-blocking glue;

(8) separating single LED chips from the fixed film and the protective film to form single end products.

Multiple LEDs, from one surface of which light could be emitted, could be fabricated simultaneously through the process of the present invention. The LED, from a single surface of which light could be emitted, could be used as a light source for a product with high light emitting requirement.

The advantageous effects of the present invention as compared with the prior art are as following:

In the present invention, multiple LEDs, from one surface of which light emitted, could be fabricated simultaneously by using a packaging process that fixing multiple LED chips, brushing light-blocking glue into the space between adjacent LED chips to form light-blocking glue layer on the side surfaces around the LED chips and the top surface, cutting to form a groove at the space between adjacent LED chips, filling the groove with light-blocking glue, and separating the multiple LED chips at last.

In order to solve the fourth problem mentioned above, the solution of the present invention is a Chip Scale Package LED including a LED chip, the top surface and four side surfaces of the LED chip covered by a fluorescent glue layer, a light-blocking glue layer arranged outside the fluorescent glue layer on the side surfaces.

The advantageous effects of the solution mentioned above are as following: there's a fluorescent glue layer arranged on side surfaces and top surface of each LED chip, while light-blocking glue layer is arranged outside the fluorescent glue layer on the side surfaces, as such light could be emitted only from the top surface, and white light could be excited from the fluorescent glue layer arranged on the top surface of the LED chip.

In order to solve the fifth problem mentioned above, the solution of the present invention is a method of packaging LED, wherein comprising the following steps:

(1) fixing multiple LED chips on a carrier plate to form an array distribution;

(2) placing a hot melt adhesive block doped with fluorescent powder on the top of the LED chips array;

(3) heating the hot melt adhesive block while applying pressure from the top of the hot melt adhesive block until the LED chips being pressed into the hot melt adhesive block, the side surfaces of the LED chips and the top surface of the reflector completely covered by the hot melt adhesive block;

(4) cutting the LED chips array to achieve single package LEDs.

Hot melt adhesive is used as a carrier of fluorescent powder in the present invention, the hot melt adhesive has a better thermoplasticity and will be soften after heated to high temperature, so that covering the hot melt adhesive on the light emitting surface of the LED chip could be facilitated. Moreover, hot melt adhesive doped with fluorescent powder could be pre-made, in normal temperature, the hot melt adhesive is solid to make the storage convenient; when needed, the hot melt adhesive could be cut into suitable size, heated and soften, then covered on the light emitting surface of the LED chip; after cooling of the hot melt adhesive, hot melt adhesive could closely contact with the surface of the LED chip.

The advantageous effects of the present invention as compared with the prior art are as following:

The hot melt adhesive doped with fluorescent powder could be pre-made, in normal temperature, the hot melt adhesive is solid to make the storage convenient; when needed, the hot melt adhesive could be cut into suitable size, heated and soften, then covered on the light emitting surface of the LED chip; after cooling of the hot melt adhesive, hot melt adhesive could closely combined with the surface of the LED chip firmly, so that the process of forming fluorescent glue layer on the light emitting surface of the LED chip easier and faster.

In order to solve the sixth problem mentioned above, the solution of the present invention is a method of fabricating LED packaging structure, wherein comprising the following steps:

(1) providing a carrier including a carrier plate with more than one concave cavity;

(2) laying isolating film on the carrier attached to the carrier plate, bottom surface of the concave cavity and side surface of the concave cavity;

(3) fixing a flip chip on the isolating film in the concave cavity;

(4) injecting packaging glue on the carrier to cover side surfaces and top surface of the flip chip; there being a height difference between the bottom surface of the concave cavity and a top surface of the carrier, so that a space formed between the packaging glue and the bottom surface of the concave cavity;

(5) cutting the LED packaging structure group after solidification of the packaging glue into single LED packaging structures;

(6) separating the isolating film from the carrier;

(7) separating the LED packaging structure from the isolating film.

In order to solve the seventh problem mentioned above, the solution of the present invention is a LED packaging structure fabricated by using the fabricating method mentioned above, the structure including a flip chip with an electrode arranged on the bottom of the flip chip, packaging glue covered on the side surfaces and the top surface of the flip chip, the bottom surface of the packaging glue being higher than that of the electrode.

The advantageous effects of the present invention are as following:

(1) By arranging concave cavity on the carrier plate, the electrode of the flip chip will be in the concave cavity when the LED packaging structure is formed. After adding packaging glue, because there's a height difference between the bottom surface of the concave cavity and surface of the carrier plate, and the packaging glue is in semi-solid state, the packaging glue will never contact with the bottom surface of the concave cavity, so that a space is formed naturally between the bottom surface of the concave cavity and the packaging glue. The bottom surface of the packaging glue will be higher than the bottom surface of the electrode after the separation of the LED packaging structure group by using the fabricating method in the present invention, so that a step could be formed between the packaging glue and the electrode.

(2) According to the process in the present invention, it needs only to form the concave cavity on the carrier plate, lay the isolating film then, place film chips, inject glue, solidify, and cut, the process steps are very simple, the object of the present invention could be achieved meanwhile, thereby reducing the cost.

(3) The packaging glue could be prevented from collapsing at a position corresponding to the concave cavity because of the arrangement of the protrusion.

(4) The side surface of the concave cavity is a slope extending towards the inside of the concave cavity from top to bottom; as such the space is controllable.

(5) When performing the step (4) mentioned above, by pressing the packaging glue with a pressing plate, the size of the space between the packaging glue and the bottom surface of the concave cavity could be controlled better, and smoothness of top surface of the packaging glue and the smoothness relative to the bottom surface of the concave cavity could be improved meanwhile.

(6) As the bottom surface of the packaging glue is higher than that of the electrode, there will be a space between the bottom surface of the packaging glue and the substrate when the CSP packaging structure is fixed on the substrate, the close contact between the electrode of the flip chip and the substrate might not be affected, even though the packaging glue has downwards burrs. Moreover, if the packaging glue expands during heating, there will be a space for the expansion under the packaging glue. Therefore, void rate of the connection between the CSP packaging structure and the substrate could be reduced, the problem that unreliable electrical connection between flip chip and the substrate may be caused by burrs produced by cutting of the packaging glue and heating during welding the electrode of the flip chip and the substrate may be solved, so that the connection between the flip chip and the substrate might be stronger.

In order to solve the eighth problem mentioned above, the solution of the present invention is a CSP packaging structure, from three surfaces of which light could be emitted, including a flip chip, two opposite side surfaces of the flip chip packaged with light-blocking glue, and the other two opposite side surfaces of the flip chip packaged with packaging glue.

Because of the light-blocking glue arranged on the opposite side surfaces in the structure mention above, the CSP packaging structure of this structure has only three light emitting surfaces, namely the two opposite side surfaces and the top surface, and light emitting angle of side surfaces of the flip chip is big. Therefore, light emitting angle of two side surfaces having light-blocking glue would be big and significantly reduced within the dark area on both sides with packaging glue by using the structure of the present invention. Together with the light reflex function of the light-blocking glue, light from the two opposite side surfaces could be reflected by the light-blocking glue, which causes a better uniformity of light emitted from three surfaces. Since light corresponding to the clamp could be blocked by light-blocking glue, loss of light emitted from light emitting device could be avoided, and light utilization could be improved.

In order to solve the ninth problem mentioned above, the solution of the present invention is a light bar based on CSP packaging structure including a flip chip, more than two CSP packaging structures, from three surfaces of which light could be emitted, arranged on a substrate, the CSP packaging structure, from three surfaces of which light emitted, including a flip chip; two opposite side surfaces of the flip chip packaged with light-blocking glue, and the other two opposite side surfaces and the top surface of the flip chip packaged with packaging glue.

Because of the light-blocking glue arranged on the opposite side surfaces in the structure mention above, the CSP packaging structure of this structure has only three light emitting surfaces, namely the two opposite side surfaces and the top surface, the two side surfaces with packaging glue is perpendicular to the substrate while light emitting angle of side surfaces of the flip chip is big, range of dark area between two CSP packaging structures, from three surfaces of which light could be emitted, could be significantly reduced. Therefore, light emitting angle of two side surfaces having light-blocking glue would be big by using the structure of the present invention, together with the light reflex function of the light-blocking glue, light from the two opposite side surfaces could be reflected by the light-blocking glue, which causes a better uniformity of light emitted from three light emitting surfaces, and light utilization could be improved.

Furthermore, by arranging light bars on both sides of the substrate, the CSP packaging structure, from three surfaces of which light could be emitted, is within the blocking bars. The light bar has light blocking function which causes light emitted more concentrated and more uniform.

DESCRIPTION OF THE EMBODIMENTS

Further illustration on the present invention will be given in the following in conjunction with drawings.

Embodiment 1

Figure 1:
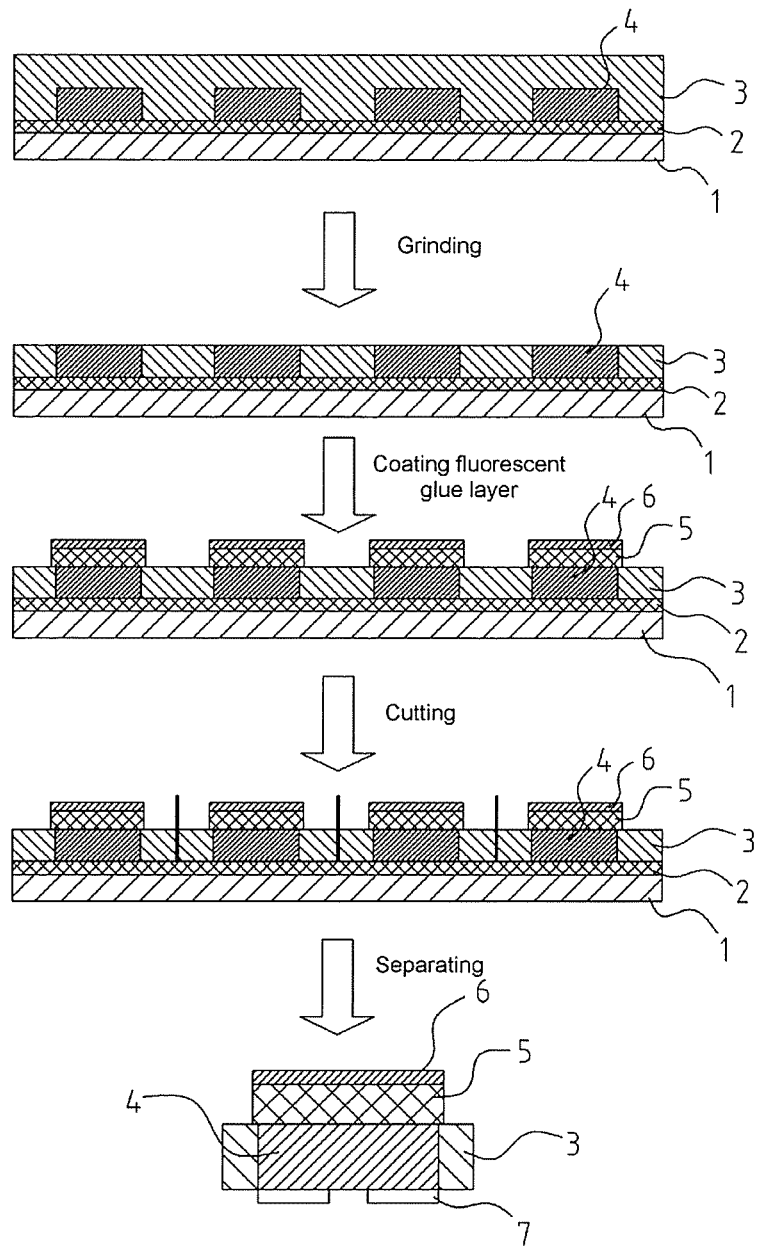
FIG. 1 is a process flow diagram of a method of packaging CSP LED.

As shown in FIG. 1, a method of packaging CSP LED, comprising the following steps:

(1) Placing a layer of fixed film 2 for fixing the position of LED chips 4 on a carrier plate 1. The fixed film 2 in this embodiment is UV double side adhesive tape film, the carrier plate 1 is a glass plate. The UV double side adhesive tape film could be fixed on one side of the glass plate directly by pasting, then separated from the glass plate by irradiating the other side of the glass plate.

(2) Distributing some LED chips 4 on the surface of the UV double side adhesive tape film, the number of LED chips 4 is designed depending on the size of the glass plate or the production requirement. The LED chips 4 could be array distribution, and there may be a space for cutting left between adjacent LED chips 4. Each space is of consistent width so that the consistency of each LED chip after cutting could be insured. The LED chip 4 is a flip chip with an electrode 7 arranged on its bottom surface, the bottom surface of the LED chip 4 is against the other side of the UV double side adhesive tape film to fix the LED chip 4 by the viscosity of the UV double side adhesive tape film.

(3) Coating a layer of light-blocking glue 3 on the LED chips 4 array through various ways, such as by brushing, dispensing or pouring. In short, the space between adjacent LED chips 4 would be fully filled with the light-blocking glue 3, the surface of the LED chips 4, from which light could be emitted, being fully covered by the light-blocking glue 3 might be better to make sure that the side surfaces of the LED chips 4 could be blocked completely by the light-blocking glue 3. However, there may be a thin layer of light-blocking glue 3 covering on the top surface of LED chips 4.

(4) Grinding solidified light-blocking glue layer by using a grinder after the solidification of the light-blocking glue 3, and grinding to remove the thin layer of light-blocking glue on the top of the LED chips 4. In order to prevent scratches caused by grinding during grinding from occurring, grinded light-blocking glue and LED chips 4 should be polished after grind of the solidified light-blocking glue layer with the grinder. As such the top surface of each LED chip 4 could be exposed as a light emitting surface. The heights of the top surface of the LED chips are leveled with the light-blocking glue on the side surfaces now.

(5) Coating a fluorescent glue layer 5 on the top surface of the LED chips 4, and the top surface of the fluorescent glue layer 5 being higher than that of the light-blocking glue 3 on the side surfaces. The specific implementation is as following:

(5.1) Coating a fluorescent glue layer 5 on the LED chips 4 array with a smooth surface so that the top surface of the LED chips 4 and the light-blocking glue 3 could be covered by the fluorescent glue layer 5 completely. The fluorescent glue layer 5 is formed by molding of uniform thickness.

(6) Laying a transparent glue layer 6 of a thickness of 80-130 μm on the fluorescent glue layer 5 of a thickness of 30-50 μm. The transparent glue layer and the fluorescent glue layer may be integrated or may be formed by laminate spraying. Light emitting effect could be improved due to a thin fluorescent glue layer 5.

Figure 5:
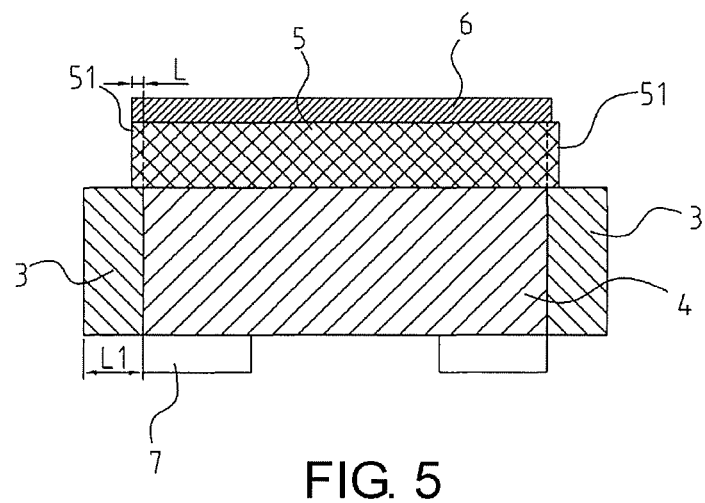
FIG. 5 is a diagram of the CSP LED of the embodiment 1, embodiment 2, and embodiment 13.

(7) Cutting to remove part or all of the fluorescent glue layer and transparent glue layer between adjacent LED chips by using a cutter. As shown in FIG. 5, the top surface of the LED chips could be covered completely by the rest fluorescent glue layer while cutting to remove part of the fluorescent glue layer and transparent glue layer between adjacent LED chips by using a cutter, and the area of the fluorescent glue layer 5 corresponding to the LED chips 4 is slightly larger than the light emitting area of the top surface of the LED chips 4. The part of fluorescent glue layer not cut on the light-blocking glue layer is light leak proof layer 51, the light leak proof layer 51 is on the top of the light-blocking glue layer and blocks the inside of the light-blocking glue layer. The light-blocking glue layer has a width of L1, said light leak proof layer 51 has a width of L, L=(⅕~½) L1. The cutter could be a carborundum grinding wheel.

(8) Cutting along the space between adjacent LED chips 4 at the center of the space and making sure that each LED chip is the same after cutting. Moreover, cutting depth is up to the UV double side adhesive tape film to make sure that the fluorescent glue layer 5 and light-blocking glue layer could be completely cut off. Each LED chip 4 is separately now, leaving only a connection through UV double side adhesive tape film.

(9) Separating the glass plate and the UV double side adhesive tape film by irradiating the glass plate with ultraviolet light.

(10) Separating the UV double side adhesive tape film, LED chips 4, light-blocking glue 3 and fluorescent glue as a whole from the carrier plate 1.

(11) Flipping the whole, and multiple separate LEDs could be made by splitting the UV double side adhesive tape film by irradiating it with ultraviolet light directly. Light-blocking glue layers are arranged on the side surfaces of each LED chip 4, and light could be emitted only from the top surface, white light could be excited from the fluorescent glue layer 5 arranged on the top surface of the LED chip 4.

Embodiment 2

As shown in FIG. 1, a method of packaging CSP LED, comprising the following steps:

(1) Placing a layer of fixed film 2 for fixing the position of LED chips 4 on a carrier plate 1. The fixed film 2 in this embodiment is thermal separation adhesive tape film which could be fixed on one side of the carrier by directly by pasting.

(2) Distributing some LED chips 4 on the surface of the thermal separation adhesive tape film, the number of LED chips 4 could be designed depending on the size of the carrier plate 1 or the production requirement. The LED chips 4 could be array distribution, and there may be a space for cutting left between adjacent LED chips 4. Each space is of consistent width so that the consistency of each LED chip after cutting could be insured. The LED chip 4 is a flip chip with electrode 7 arranged on its bottom surface, the bottom surface of the LED chip 4 is against the other side of the thermal separation adhesive tape to fix the LED chip 4 by the viscosity of the thermal separation adhesive tape.

(3) Coating a layer of light-blocking glue 3 on the LED chips 4 array through various ways, such as by brushing, dispensing or pouring. In short, the space between adjacent LED chips 4 would be fully filled with the light-blocking glue 3, the surface of the LED chips 4, from which light could be emitted, being fully covered by the light-blocking glue 3 might be better to make sure the side surfaces of the LED chips 4 could be blocked completely by the light-blocking glue 3. However, there may be a thin layer light-blocking glue 3 covered on the top surface of LED chips 4.

(4) Grinding solidified light-blocking glue by using a grinder after the solidification of the light-blocking glue 3, and grinding to remove the thin layer of light-blocking glue on the top surfaces of the LED chips 4. In order to prevent scratches caused by grinding during grinding from occurring, grinded light-blocking glue and LED chips 4 should be polished after grind of the solidified light-blocking glue layer with the grinder. As such the top surface of each LED chip 4 could be exposed as a light emitting surface. The heights of the top surfaces of the LED chips are leveled with the light-blocking glue on the side surfaces.

(5) Coating a fluorescent glue layer 5 on the top surfaces of the LED chips 4, and the top surface of the fluorescent glue layer 5 being higher than the top surface of the light-blocking glue on the side surfaces. The specific implementation is as following:

(5.1) Coating a fluorescent glue layer 5 on the LED chips array with a smooth surface so that the top surfaces of the LED chips and the light-blocking glue could be covered by the fluorescent glue layer completely. The fluorescent glue layer 5 is a fluorescent patch and of uniform thickness.

(6) Laying a transparent glue layer 6 of a thickness of 80-130 μm on the fluorescent glue layer 5 of a thickness of 30-50 μm. The transparent glue layer and the fluorescent glue layer may be an integrated glue layer pasting on the top surfaces of the light-blocking glue layer and the LED chips. Also, the transparent glue layer and the fluorescent glue layer may be formed by laminate spraying. Light emitting effect could be improved due to a thin fluorescent glue layer.

Figure 2:
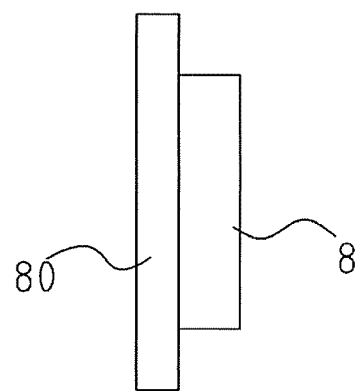
FIG. 2 is a structure diagram I of a combined cutter.
Figure 3:
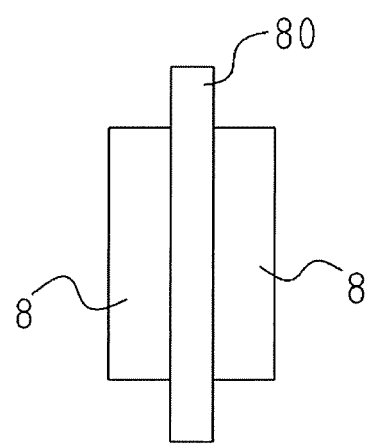
FIG. 3 is a structure diagram II of a combined cutter.

(7) Cutting the space between adjacent LED chips 4 at the center of the space by using a cutter with combined multi-cutters and making sure that each LED chip is the same after cutting. The combined cutter includes a primary cutter 80 and a secondary cutter 8. As shown in FIG. 2, the secondary cutter 8 may be arranged on one side of the primary cutter 80. Optionally, as shown in FIG. 3, the secondary cutter 8 may be on both sides of the primary cutter 80. The primary cutter 80 could be a carborundum grinding wheel. The cutting may be performed along center of the space between adjacent LED chips with the primary cutter 80, and cutting depth is up to the fixed film to make sure that the fluorescent glue layer and light-blocking glue layer could be completely cut off. The secondary cutter 8 may be used to cut to remove part or all of the fluorescent glue layer and the transparent glue layer between the primary cutter 80 and the LED chips. As shown in FIG. 5, the surface of the LED chips could be covered completely by the rest fluorescent glue layer while cutting to remove part of the fluorescent glue layer and the transparent glue layer between the primary cutter 80 and the LED chips by using the secondary cutter 8, and the area of the fluorescent glue layer corresponding to the LED chips is slightly larger than the light emitting area of the top surface of the LED chips. The part of fluorescent glue layer not cut on the light-blocking glue layer is light leak proof layer 51, the light leak proof layer 51 is on the top of the light-blocking glue layer and blocks the inside of the light-blocking glue layer. The light-blocking glue layer has a width of L1, the light leak proof layer 51 has a width of L, L=(⅕~½) L1. Moreover, the cutting depth of the primary cutter 80 is up to thermal separation adhesive to make sure that the fluorescent glue layer 5 and the light-blocking glue layer could be completely cut off. Each LED chip 4 is separately now, leaving only a connection through the thermal separation adhesive.

(8) Separating LED chips 4 by heating the carrier plate 1 to form multiple separate LEDs. Light-blocking glue layer are arranged on the side surfaces of each LED chip 4, and light could be emitted only from the top surface, white light could be excited from the fluorescent glue layer 5 arranged on the top surface of the LED chip 4.

Embodiment 3

As shown in FIG. 1, a method packaging of CSP LED, comprising the following steps:

(1) Placing a layer of fixed film 2 for fixing the position of LED chips 4 on a carrier plate 1. The fixed film 2 in this embodiment is UV double side adhesive tape film, the carrier plate 1 is a glass plate. The UV double side adhesive tape film could be fixed on one side of the glass plate directly by pasting, then separated from the glass plate by irradiating the other side of the glass plate.

(2) Distributing some LED chips 4 on the surface of the UV double side adhesive tape film, the number of LED chips 4 is designed depending on the size of the glass plate or the production requirement. The LED chips 4 could be array distribution, and there may be a space for cutting left between adjacent LED chips 4. Each space is of consistent width so that the consistency of each LED chip after cutting could be insured. The LED chip 4 is a flip chip with electrode 7 arranged on its bottom surface, the bottom surface of the LED chip 4 is against the other side of the UV double side adhesive tape film to fix the LED chip 4 by the viscosity of the UV double side adhesive tape film.

(3) Coating a layer of light-blocking glue 3 on the LED chips 4 array through various ways, such as by brushing, dispensing or pouring. In short, the space between adjacent LED chips 4 could be fully filled with the light-blocking glue 3, the surface of the LED chips 4, from which light could be emitted, being fully covered by the light-blocking glue 3 might be better to make sure that the side surfaces of the LED chips 4 could be blocked completely by the light-blocking glue 3. However, there may be a thin layer of light-blocking glue 3 covering on the top surface of LED chips 4.

(4) Grinding solidified light-blocking glue by using a grinder after the solidification of the light-blocking glue 3, and grinding to remove the thin layer of light-blocking glue layer on the top of the LED chips 4. In order to prevent scratches caused by grinding during grinding from occurring, grinded light-blocking glue layer and LED chips 4 should be polished after grind of the solidified light-blocking glue layer with the grinder. As such the top surface of each LED chip 4 could be exposed as a light emitting surface. The heights of the top surfaces of the LED chips are leveled with the light-blocking glue on the side surfaces now.

Figure 4:
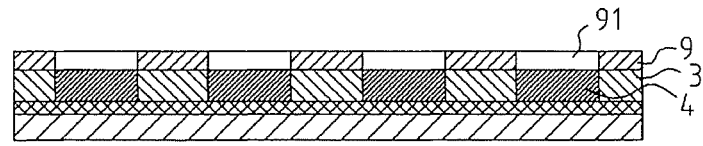
FIG. 4 is a section view of matching of a grille with LED chips array.

(5) Coating a fluorescent glue layer 5 on the top surfaces of the LED chips 4, and the top surface of the fluorescent glue layer 5 being higher than that of the light-blocking glue on the side surfaces. The specific implementation is as following:

(5.1) As shown in FIG. 4, placing a grille 9 on the LED chips 4 array with a smooth surface, holes 91 are arranged on said grille 9 corresponding to each LED chips, the area of hole 91 is slightly larger than the area of the top surface of the LED chip 4. The LED chips 4 could be exposed through the holes 9 while part or all of the light-blocking glue between adjacent LED chips 4 could be blocked by the grille 9.

(5.2) If the light-blocking glue between adjacent LED chips 4 could be blocked by the grille 9 completely, then coating fluorescent glue on the grille, the fluorescent glue might flow into the holes. Because of the blocking by the grille, the fluorescent glue, which may form a fluorescent glue layer after solidification, could be on the top surfaces of the LED chips only. If the light-blocking glue between adjacent LED chips 4 could be blocked by the grille 9 completely, as shown in FIG. 5, the top light emitting surface of the LED chips could be covered completely by the fluorescent glue layer. The fluorescent glue layer uncovered on the top surface of the light-blocking glue layer is light leak proof layer 51, the light leak proof layer 51 is on the top of the light-blocking glue layer and blocks the inside of the light-blocking glue layer. The light-blocking glue layer has a width of L1, said light-blocking glue layer has a width of L, L=(⅕~½) L1.

(6) Laying a transparent glue layer 6 of a thickness of 80-130 µm on the fluorescent glue layer 5 of a thickness of 30-50 µm. The transparent glue layer and the fluorescent glue layer may be integrated or may be formed by laminate spraying. Light emitting effect could be improved due to a thin fluorescent glue layer.

(7) Cutting along the light-blocking glue layer between adjacent LED chips 4 at the center of the space and making sure that each LED chip is the same after cutting. Moreover, cutting depth is up to the UV double side adhesive tape film to make sure that the fluorescent glue layer 5 and light-blocking glue layer could be completely cut off. Each LED chip 4 is separately now, leaving only a connection through UV double side adhesive tape film.

(8) Integrating the glass plate to separate it with the UV double side adhesive tape film.

(9) Separating the UV double side adhesive tape film, LED chips 4, light-blocking glue 3 and fluorescent glue as a whole from the carrier plate 1.

(10) Flipping the whole, and multiple separate LEDs could be made by splitting the UV double side adhesive tape film by irradiating it with ultraviolet light directly. Light-blocking glue layers are arranged on the side surfaces of each LED chip 4, and light could be emitted only from the top surface, white light could be excited from the fluorescent glue layer 5 arranged on the top surface of the LED chip 4.

Embodiment 4

Figure 6:
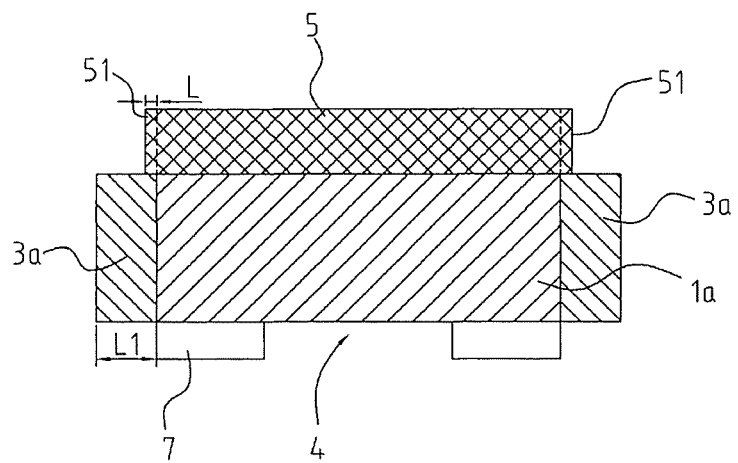
FIG. 6 is a diagram of the CSP LED of the embodiment 4 and embodiment 5.
Figure 7:
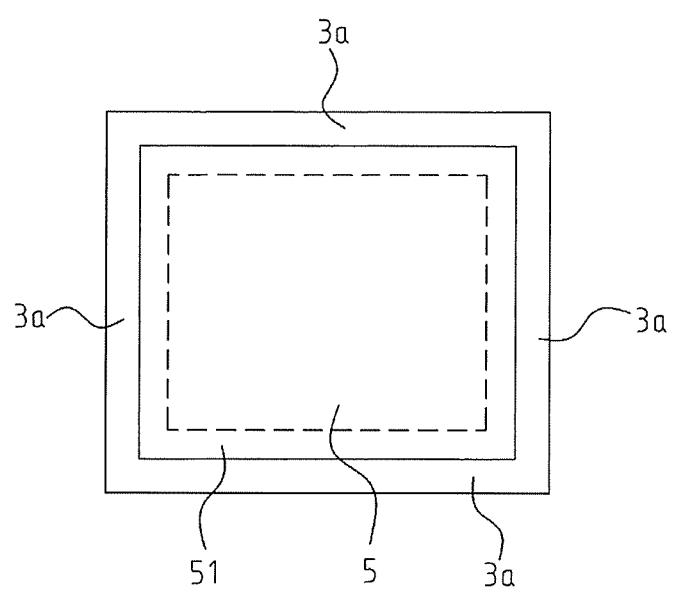
FIG. 7 is a top view of the CSP LED of the embodiment 4 and embodiment 5.

As shown in FIG. 6 and FIG. 7, a CSP LED includes a LED chip 4, the LED chip 4 includes a semiconductor chip 1a and an electrode arranged on the bottom of the semiconductor chip 1a. The semiconductor chip 1a is square of which the top surface and four side surfaces are all light emitting surfaces. Light-blocking glue layer 3a blocks are arranged on all the light emitting surfaces of said semiconductor chip 1a and used for blocking light emitted from side surfaces of the LED chip 4. There's a fluorescent glue layer 5 covering on the light emitting surface on the top surface of said semiconductor chip 1a. The fluorescent glue layer 5 is used for being excited to form white light by blue light, and a step is formed by the top surface of the fluorescent glue layer 5 and that of the light-blocking glue layer 3. Specifically, a layer of light leak proof layer 51 is arranged around said fluorescent glue layer 5 along the edge the fluorescent glue layer 5, said light leak proof layer 51 is on the top of the light-blocking glue layer 3a and blocks the inside of the light-blocking glue layer 3a. Said light-blocking glue layer 3a has a width of L1, said light leak proof layer has a width of L, L=(⅕~½)L1. Said light leak proof layer 51 and the fluorescent glue layer 5 is an integrally formed structure which is a part of the fluorescent glue layer 5. The edge of the fluorescent glue layer 5 protrudes outwards to prevent light leak mainly with part of the top surface of the LED chip. A transparent glue layer is arranged on said fluorescent glue layer 5. The lower end of said light-blocking glue layer 3a is leveled with the bottom of the semiconductor chip 1a. There is a certain space left between lower end of said light-blocking glue layer 3a and the substrate when the die bond of the LED chip is performed to prevent lack of space for expansion of the light-blocking glue layer 3a during heating from damaging the device.

The fluorescent glue layer 5 in this embodiment is formed by molding. The forming process is as follows: first, covering a light-blocking glue layer 3a on the side surface of the LED chip, then covering a fluorescent glue layer 5 on the top surface of the LED chip. In order to simplify the forming process of the fluorescent glue layer 5, the LED chip and the light-blocking glue layer 3a around would be completely covered by the fluorescent glue layer 5 formed. At last, cutting to remove the edge of the fluorescent glue layer 5.

By adding a light-blocking glue layer 3a on the side surface of the flip LED chip in the present invention, light could be emitted only from top surface rather than four side surfaces of the LED chip. The side surfaces of the LED chip is blocked by the light-blocking glue layer, since amount of blue light emitted from side surfaces of the LED chip is smaller than that of blue light emitted from center of the LED chip, if fluorescent glue layer is covered on the top surface of the light-blocking glue layer, a yellow circle may appear after the excitation of blue light emitted from side surfaces of the LED chip through the fluorescent glue around, thereby influencing the effect of light emitting of LED. A better effect of light emitting of LED could be achieved in the present invention by cutting to remove peripheral fluorescent glue of the top surface of the LED chip, so that blue light couldn't excite from side surface of the LED chip. Moreover, the light leak proof layer 51 around the fluorescent glue layer 5 could prevent blue light from the side surfaces of the LED chip from emitting from bonding surface of the light-blocking glue layer 3a and side surfaces of the chip to influence total efficiency of the LED chip.

Embodiment 5

As shown in FIG. 6 and FIG. 7, a CSP LED includes a LED chip 4, the LED chip 4 includes a semiconductor chip 1a and an electrode arranged on the bottom of the semiconductor chip 1a. The semiconductor chip 1a is square of which the top surface and four side surfaces are all light emitting surfaces. Light-blocking glue layer 3a blocks are arranged on all the light emitting surfaces of said semiconductor chip 1a and used for blocking light emitted from side surfaces of the LED chip. There's a fluorescent glue layer 5 covering on the light emitting surface on the top surface of said semiconductor chip 1a. The fluorescent glue layer 5 is used for being excited to form white light by blue light, and a step is formed by the top surface of the fluorescent glue layer and that of the light-blocking glue layer. Specifically, a layer of light leak proof layer 51 is arranged around said fluorescent glue layer 5 along the edge the fluorescent glue layer 5, said light leak proof layer 51 is on the top of the light-blocking glue layer 3a and blocks the inside of the light-blocking glue layer 3a. Said light-blocking glue layer 3a has a width of L1, said light leak proof layer has a width of L, and L=(⅕~½) L1. Said light leak proof layer 51 and the fluorescent glue layer 5 is an integrally formed structure which is a part of the fluorescent glue layer 5. The edge of the fluorescent glue layer 5 protrudes outwards to prevent light leak mainly with part of the top surface of the LED chip. A transparent glue layer is arranged said fluorescent glue layer 5. The lower end of the fluorescent glue layer 3a is leveled with the bottom of the semiconductor chip 1a. There would be a certain space left between lower end of the light-blocking glue layer 3a and the substrate when the LED chip die bond is performed, to prevent lack of space for expansion of the light-blocking glue layer 3a during heating from damaging the device.

The fluorescent glue layer 5 in this embodiment a fluorescent patch the forming process of which is as follows: first, covering a light-blocking glue layer 3a on the side surfaces of the LED chip then covering a fluorescent patch on the top surface of the LED chip. The size of the fluorescent patch may be pre-cut, and the process is completed after the fluorescent patch is pasted on the top surface of the LED.

By adding a light-blocking glue layer 3a on the side surfaces of the flip LED chip in the present invention, light could be emitted only from top surface rather than four side surfaces of the LED chip. The side surfaces LED chip is blocked by the light-blocking glue layer, since amount of blue light emitted from side surfaces of the LED chip is smaller than that of blue light emitted from center of the LED chip, if fluorescent glue is covered on the top surface of the light-blocking glue, a yellow circle may appear after the excitation of blue light emitted from side surfaces of the LED chip through the fluorescent glue around, thereby influencing the effect of light emitting of LED. The present invention achieves a better effect of light emitting of LED by cutting to remove peripheral fluorescent glue of the top surface of the LED chip, so that blue light couldn't be excited from side surface of the LED chip. Moreover, the light leak proof layer 51 around the fluorescent glue layer 5 could prevent blue light emitting from bonding surface of the light-blocking glue layer 3a and side surfaces of the chip from influencing total efficiency of the LED chip.

Embodiment 6

Figure 8:
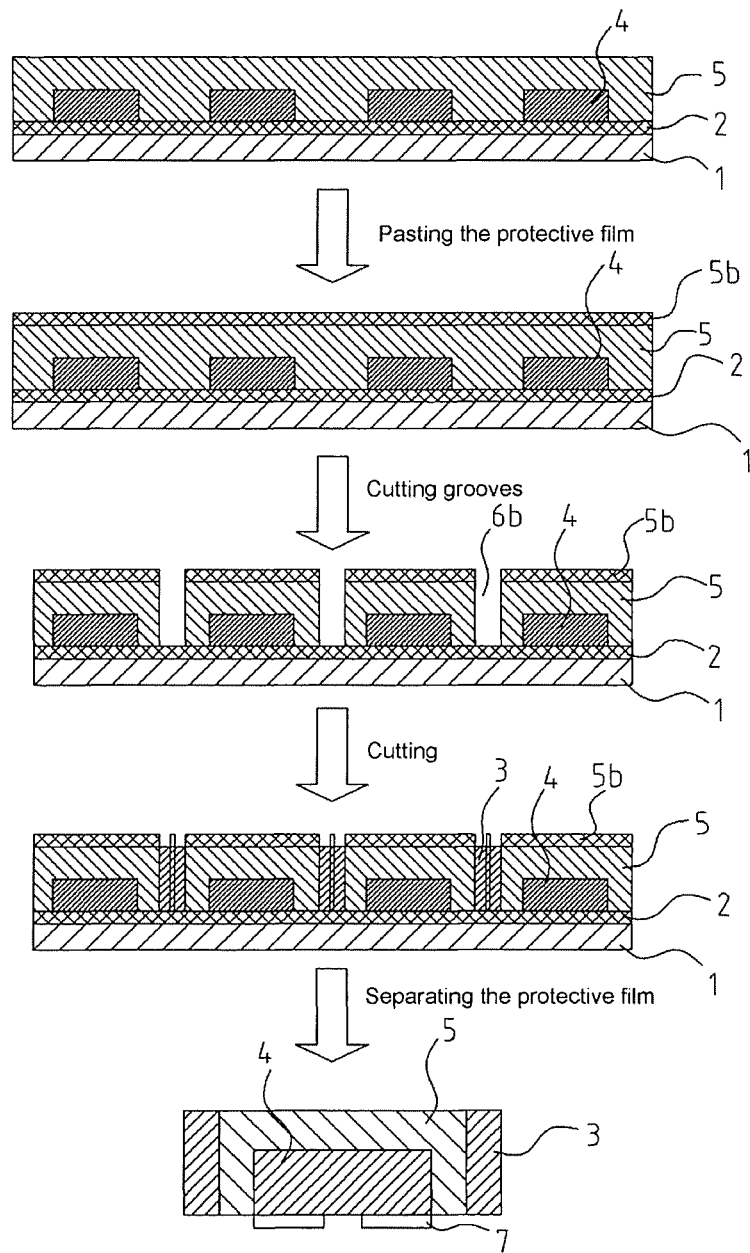
FIG. 8 is the process flow diagram of the embodiment 6 and embodiment 7.

As shown in FIG. 8, a method of packaging Chip Scale Package LED, comprising the following steps:
(1) Placing a layer of fixed film 2 for fixing the position of LED chips 4 on a carrier plate 1. The fixed film 2 in this embodiment is UV double side adhesive tape film, the carrier plate 1 is a glass plate. The UV double side adhesive tape film could be fixed on one side of the glass plate directly by pasting, then separated from the glass plate by irradiating the other side of the glass plate.

(2) Distributing some LED chips 4 on the surface of the UV double side adhesive tape film, the number of LED chips 4 is designed depending on the size of the glass plate or the production requirement. The LED chips 4 could be array distribution, and there may be a space for cutting left between adjacent LED chips 4. Each space is of consistent width so that the consistency of each LED chip after cutting could be insured. The LED chip 4 is a flip chip with electrode 7 arranged on its bottom surface, the bottom surface of the LED chip 4 is against the other side of the fixed film 2 to fix the LED chip 4 by the viscosity of the fixed film 2.

(3) Molding a layer of fluorescent glue on the LED chips 4 array, the space between adjacent LED chips 4 would be fully filled with the fluorescent glue, and the top surface and side surfaces of the LED chips 4 are all covered by fluorescent glue.

(4) Pasting a protective layer 5b on the surface of the fluorescent glue layer 5 after solidification of the fluorescent glue. The protective layer 5b is UV double side adhesive tape film.

(5) Cutting at space between adjacent LED chips 4 with a blade to form a groove 6b between adjacent LED chips 4, the section of the groove 6b is square and has a width of 0.3-0.5 mm, a depth up to the fixed film 2. The fluorescent glue layer 5 and the protective layer 5b could be cut off by the groove 6b.

(6) Filling the grooves 6b with light-blocking glue 3, the light-blocking glue 3 could be adding by brushing. A light-blocking glue layer could be formed after solidification of the light-blocking glue 3. The top surface of the light-blocking glue layer is leveled with that of the fluorescent glue layer 5 or higher than it.

(7) Cutting along center of the light-blocking glue layer to make sure that each LED chip is of same thickness as the light-blocking glue layer after cutting. Cutting depth is up to the fixed film 2 to make sure that the fluorescent glue layer and light-blocking glue layer could be completely separated.

(8) Separating each single LED chip 4 from the fixed film 2 and protective film 5b to form single end products. There's fluorescent glue layer 5 arranged on side surfaces and top surface of each LED chip 4, while light-blocking glue layer is arranged outside the fluorescent glue layer 5 on the side surfaces, as such light could be emitted from the top surface and white light could be excited from the fluorescent glue layer arranged on the top surface of the LED chip 4.

Embodiment 7

As shown in FIG. 8, a method of packaging Chip Scale Package LED, comprising the following steps:

(1) Placing a layer of fixed film 2 for fixing the position of LED chips 4 on a carrier plate 1. The fixed film 2 in this embodiment is thermal separation adhesive tape film; the carrier plate 1 is a glass plate. The thermal separation adhesive tape film could be fixed on one side of the glass plate directly by pasting, then separated from the carrier plate 1 by irradiating the carrier plate 1.

(2) Distributing some LED chips 4 on the surface of the fixed film 2, the number of LED chips 4 is designed depending on the size of the glass plate or the production requirement. The LED chips 4 could be array distribution, and there may be a space for cutting left between adjacent LED chips 4. Each space is of consistent width so that the consistency of each LED chip after cutting could be insured. The LED chip 4 is a flip chip with electrode 7 arranged on its bottom surface, the bottom surface of the LED chip 4 is against the other side of the fixed film 2 to fix the LED chip 4 by the viscosity of the fixed film 2.

(3) Molding a layer of fluorescent glue on the LED chips 4 array, the space between adjacent LED chips 4 could be fully filled with the fluorescent glue, and the top surface and side surfaces of the LED chips 4 are all covered by fluorescent glue.

(4) Pasting a protective film 5b on the surface of the fluorescent glue layer 5 after solidification of the fluorescent glue. The protective film 5b is thermal separation adhesive tape film.

(5) Cutting at space between adjacent LED chips 4 with a blade to form a groove 6b between adjacent LED chips 4, the section of the groove 6b is square and has a width of 0.3-0.5 mm, a depth up to the fixed film 2. The fluorescent glue layer 5 and the protective film 5b could be cut off by the groove 6b.

(6) Filling the grooves 6b with light-blocking glue 3, the light-blocking glue 3 could be added by brushing. A light-blocking glue layer could be formed after solidification of the light-blocking glue 3. The top surface of the light-blocking glue layer is leveled with that of the fluorescent glue layer 5 or higher than it.

(7) Cutting along center of the light-blocking glue layer to make sure that each LED chip is of same thickness as the light-blocking glue layer after cutting. Cutting depth is up to the fixed film 2 to make sure that the fluorescent glue layer 5 and light-blocking glue layer could be completely separated.

(8) Separating each single LED chip 4 from the fixed film 2 and protective film 5b to form single end products. There's fluorescent glue layer 5 arranged on side surfaces and top surface of each LED chip 4, while light-blocking glue layer is arranged outside the fluorescent glue layer 5 on the side surfaces, as such light could be emitted from the top surface and white light could be excited from the fluorescent glue layer arranged on the top surface of the LED chip 4.

Embodiment 8

Figure 9:
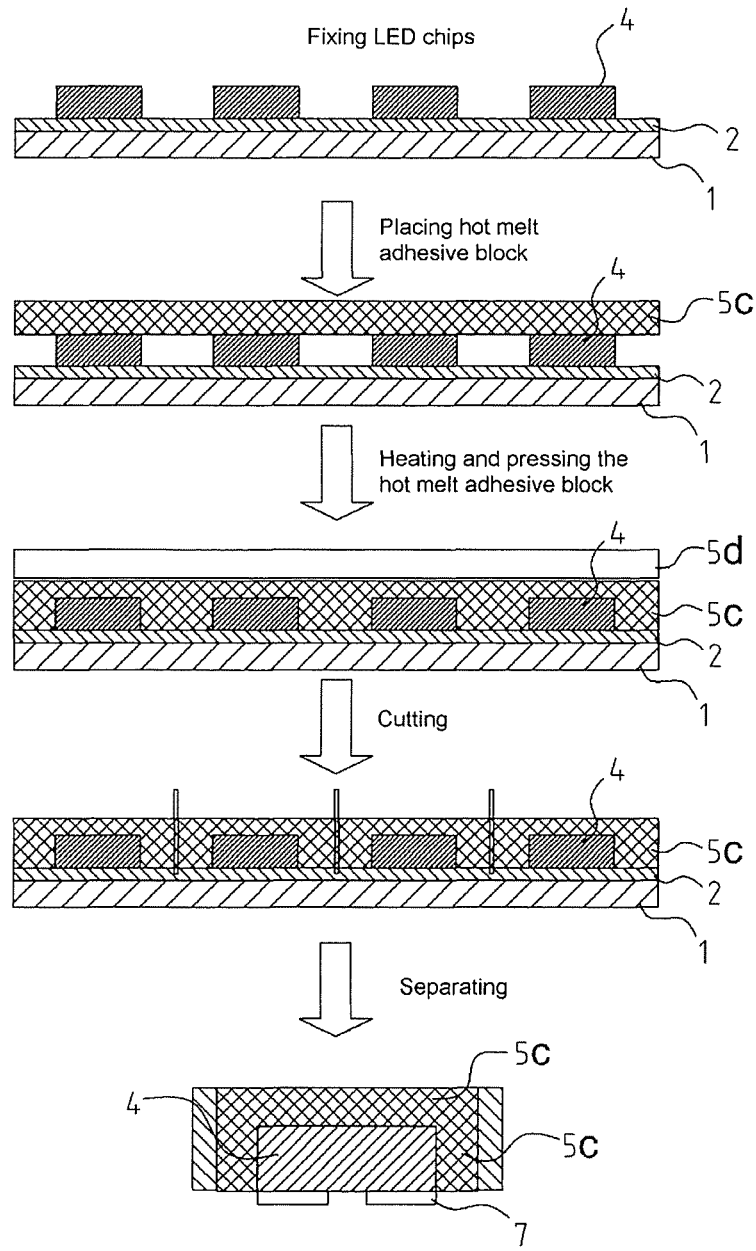
FIG. 9 is the process flow diagram of the embodiment 8 and embodiment 9.

A method of packaging LED, the LED is Chip Scale Package white light LED with an electrode arranged on the bottom of the LED chip, and four surfaces and top surface of the LED are all light emitting surfaces, white light is emitted by excitation of fluorescent powder by blue light. As shown in FIG. 9, the method of packaging LED comprises the following steps:

(1) Fixing multiple LED chips 4 on the carrier plate 1 to form a rectangle array distribution. The carrier plate 1 is a glass plate. The specific packaging method comprises the following steps:

(1.1) First, placing a layer of fixed film 2 on the carrier plate 1, the fixed film 2 in this embodiment is UV double side adhesive tape film.

(1.2) Then fixing the bottom of the LED chips 4 on the UV double side adhesive tape film, and irradiating the carrier plate 1 with ultraviolet rays to separate the LED chips 4 from the UV double side adhesive tape film. For cutting of the LED chips 4 in later process, there's a space left between adjacent LED chips 4 and the distance between spaces between adjacent LED chips 4 are equal.

(2) Placing a hot melt adhesive block 5c doped with fluorescent powder on the top of the LED chips 4 array, the fabricating method of the hot melt adhesive block doped with fluorescent powder is as follows:

(2.1) Heating the hot melt adhesive to molten state and adding fluorescent powder, the proportion of the fluorescent powder to the melt adhesive could be set according to requirement. Skilled person in the art would know how to match fluorescent powder in hot melt adhesive from existing proportion of the fluorescent powder to the hot melt adhesive.

(2.2) Mixing the hot melt adhesive so that the fluorescent powder could be evenly distributed in the hot melt adhesive. The more evenly, the better.

(2.3) Pouring the hot melt adhesive into a square mould to be cooled and to form a square shape hot melt adhesive block 5c.

Figure 10:
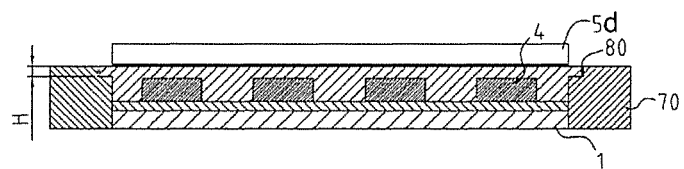
FIG. 10 is a diagram of matching of the hot melt adhesive block and the limiting device of the embodiment 8.

(3) Pressing the top of the hot melt adhesive block 5c with a press block 5d, heating to soften the hot melt adhesive block 5c with thermal produced by the press block 5d until the LED chips 4 could be pressed into the hot melt adhesive, side surfaces and top surface of the LED chips 4 are completely covered by hot melt adhesive. Limiting the falling depth of the hot melt adhesive block 5c with a limiting device, so that the bottom of the hot melt adhesive block 5c is leveled with the bottom of the LED chips 4, electrode 7 being exposed on the bottom of the LED chips 4. As shown in FIG. 10, said limiting device is a boss 70 arranged at the side of the hot melt adhesive block 5c with a groove 80 arranged thereon. The side of the hot melt adhesive block 5c is placed in the groove 80, depth H of the groove 80 is the falling depth of the hot melt adhesive block 5c.

(4) Cutting along center of the space between adjacent LED chips 4. Cutting depth is up to the UV double side adhesive tape film on the carrier plate 1 to separate adjacent LED chips 4.

(5) Irradiating the UV double side adhesive film from the bottom surface of the carrier 1 with ultraviolet rays so that the LED chips 4 could be separated from the UV double side adhesive film to achieved single LEDs.

In order to achieve that light could be emitted from a single surface of the LED, a layer of light-blocking glue could be covered on the side surfaces of the LED. Light emitted from the side surfaces of the LED chip 4 could be blocked by the light-blocking glue, leaving only the top surface of the LED chip 4 as a light emitting surface. LED, with one light emitting surface has a better light emitting uniformity.

Embodiment 9

A method of packaging LED, the LED is Chip Scale Package white light LED with an electrode arranged on the bottom of LED chip 4, and four surfaces and top surface of the LED are all light emitting surfaces, white light is emitted by excitation of fluorescent by blue light. As shown in FIG. 9, the method of packaging LED comprises the following steps:

(1) Fixing multiple LED chips 4 on the carrier plate 1 to form a circle array distribution. The carrier plate 1 is a glass plate. The specific fixing method comprises the following steps:

(1.1) First, placing a layer of fixed film 2 on the carrier plate 1, the fixed film 2 in this embodiment is thermal adhesive tape film.

(1.2) Then fixing the bottom of the LED chips 4 on the thermal adhesive tape film and irradiating the carrier plate 1 to separate the LED chips 4 from the thermal adhesive tape film. For cutting of the LED chips 4 in later process, there's a space left between adjacent LED chips 4 and the distance between spaces between adjacent LED chips 4 are equal.

(2) Placing a hot melt adhesive block 5c doped with fluorescent powder on the top of the LED chips 4 array, the fabricating method of the hot melt adhesive block 5c doped with fluorescent powder is as follows:

(2.1) Heating the hot melt adhesive to molten state and adding fluorescent powder, the proportion of the fluorescent powder to the melt adhesive could be set according to requirement. Skilled person in the art would know how to match fluorescent powder in hot melt adhesive from existing proportion of the fluorescent powder to the melt adhesive.

(2.2) Mixing the hot melt adhesive so that the fluorescent powder could be evenly distributed in the hot melt adhesive. The more evenly, the better.

(2.3) Pouring the hot melt adhesive into a circle mould to be cooled and to form a circle shape hot melt adhesive block 5c.

(3) Pressing the top of the hot melt adhesive block 5c with a press block 5d, transferring heat to the hot melt adhesive block 5c by a heating device through the press block 5d, and softening the hot melt adhesive block 5c until the LED chips 4 could be pressed into the hot melt adhesive, side surfaces and top surface of the LED chips 4 are completely covered by the melt adhesive. Limiting the falling depth of the hot melt adhesive block 5c with a limiting device, so that the bottom of the hot melt adhesive block 5c is leveled with the bottom of the LED chips 4, the electrode 7 being exposed on the bottom of the LED chips 4. Said limiting device is a bump arranged on the carrier plate 1, and the height difference between LED chips 4 and the bump is a falling depth of the hot melt adhesive block 5c.

(4) Cutting along center of the space between adjacent LED chips 4. Cutting depth is up to the thermal adhesive tape film on the carrier plate 1 to separate adjacent LED chips 4.

(5) Heating the carrier plate 1 to separate the LED chips 4 from the thermal adhesive tape film, and single LEDs achieved.

In order to achieve that light could be emitted from one surface of the LED, a layer of light-blocking glue could be covered on the side surfaces of the LED. Light emitted from the side surfaces of the LED chip 4 could be blocked by the light-blocking glue, leaving only the top surface of the LED chip 4 as a light emitting surface. LED with a single light emitting surface has a better light emitting uniformity.

Embodiment 10

Figure 11:
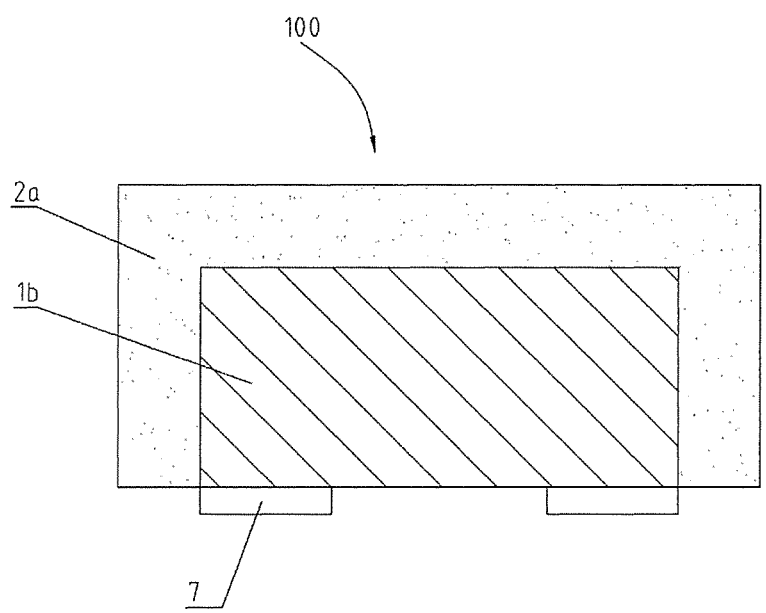
FIG. 11 is a diagram of the LED packaging structure of embodiment 10.

As shown in FIG. 11, a LED packaging structure 100 includes a flip chip 1b. The flip chip 1b includes a flip chip body and an electrode 7 arranged on the bottom of the flip chip body and protruding from the bottom of the flip chip body. Packaging glue 2a is covered on side surfaces and top surface of the flip chip body, the packaging glue 2a is fluorescent glue. The bottom surface of the packaging glue 2a is higher than that of the electrode 7. In this embodiment, the bottom surface of the packaging glue 2a is leveled with that of the flip chip body.

Figure 12:
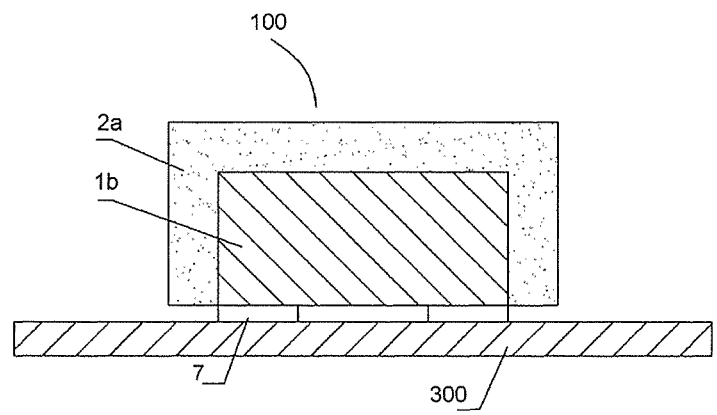
FIG. 12 is a diagram of a LED device of embodiment 10.

As shown in FIG. 12, because the bottom surface of the packaging glue 2a is higher than that of the electrode 7, there will be a space between the bottom surface of the packaging glue 2a and substrate 300 when the LED packaging structure 100 is fixed on the substrate 300. Therefore, the close contact between the electrode 7 of the flip chip and the substrate 300 would not be affected, even though the packaging glue has downwards burrs. Moreover, if the packaging glue 2a expands during heating, there will be a space for the expansion under the packaging glue 2a, thereby reducing void rate of the connection between the LED packaging structure 100 and substrate 300, the problem that unreliable electrical connection between flip chip 1b and the substrate 300 may be caused by burrs produced by cutting of the packaging glue 2a and heating during welding the electrode 7 of the flip chip and the substrate 2 may be solved.

Embodiment 11

As shown in FIG. 12, a LED device includes a LED packaging structure 100 and a substrate 300. The LED packaging structure 100 includes a flip chip 1b. The flip chip 1b includes a flip chip body and an electrode 7 arranged on the bottom of the flip chip body and protruding from the bottom of the flip chip body. Packaging glue 2a is covered on side surfaces and top surface of the flip chip body, said packaging glue 2a is fluorescent glue. The bottom surface of the packaging glue 2a is higher than that of the electrode 7. In this embodiment, the bottom surface of the packaging glue 2a is leveled with that of the flip chip body.

As shown in FIG. 12, because the bottom surface of the packaging glue 2a is higher than that of the electrode 7, there will be a space between the bottom surface of the packaging glue 2a and substrate 300 when the LED packaging structure 100 is fixed on the substrate 300. Therefore, the close contact between the electrode 7 of the flip chip and the substrate 300 would not be affected, even though the packaging glue has downwards burrs. Moreover, if the packaging glue 2a expands during heating, there will be a space for the expansion under the packaging glue 2a, thereby reducing void rate of the connection between the LED packaging structure 100 and substrate 300, the problem that unreliable electrical connection between flip chip 1b and the substrate 300 may be caused by burrs produced by cutting of the packaging glue 2a and heating during welding the electrode 7 of the flip chip and the substrate 2 may be solved, so that the connection of the flip chip 1b and the substrate 300 may be stronger.

Embodiment 12

Figure 13:
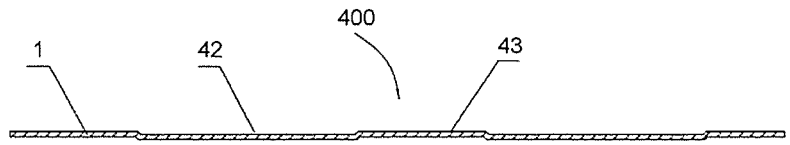
FIG. 13 is a diagram of a carrier.

A method of fabricating the LED packaging structure in the embodiment 11 described above is:

(1) As shown in FIG. 13, providing a carrier 400 including a carrier plate 1 with more than one concave cavity 42. The side surface of the concave cavity 42 is a slope extending toward the inside of the concave cavity 42 from top to bottom, as such the space between the packaging glue 2a and the concave cavity 42 is uniform and controllable.

Figure 14:
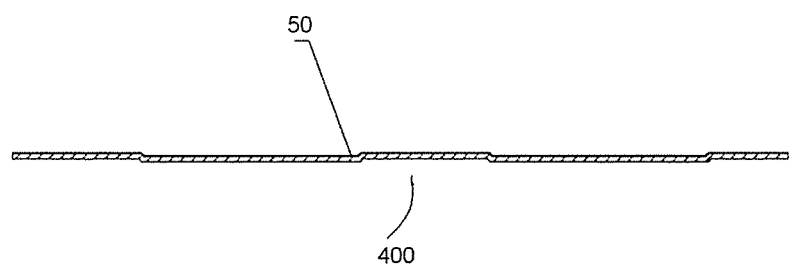
FIG. 14 is a diagram of laying isolation film.

(2) As shown in FIG. 14, laying isolating film 50 on the carrier 400 attached to the carrier plate 1, the bottom surface of the concave cavity 42 and the side surface of the concave cavity. In this embodiment, the isolating film is UV film.

Figure 15:
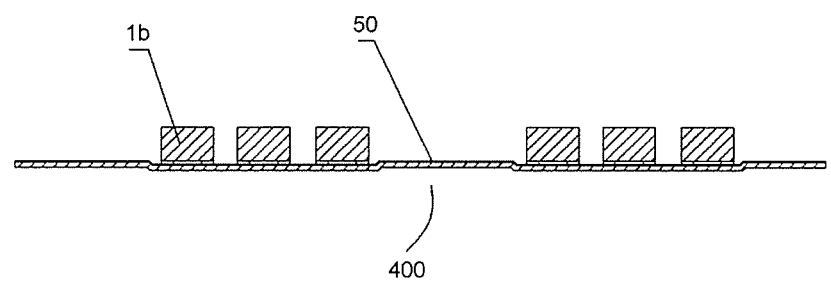
FIG. 15 is a diagram of fixing a flip chip.

(3) As shown in FIG. 15, fixing the flip chip 1b on the isolating film 50 in the concave cavity 42, connecting the electrode 7 of the flip chip 1b with the isolating film. The electrode 7 will be in the cavity 42 after the flip chip 1b is fixed on the isolating film 50. The bottom surface of the electrode 7 is leveled with the top surface of the isolating film or slightly lower than it.

Figure 16:
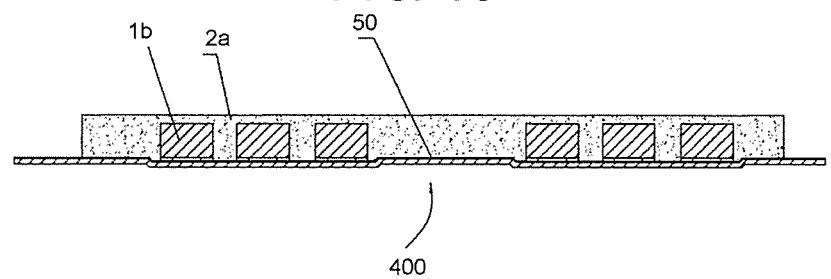
FIG. 16 is a diagram of adding packaging glue.
Figure 17:
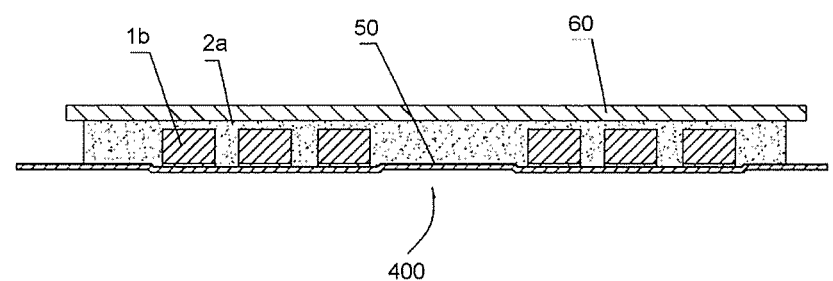
FIG. 17 is a diagram of pressing packaging glue.
Figure 18:
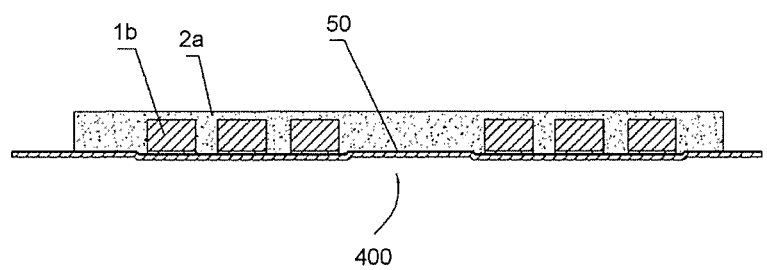
FIG. 18 is a diagram after the removal of the pressing plate.
Figure 21:
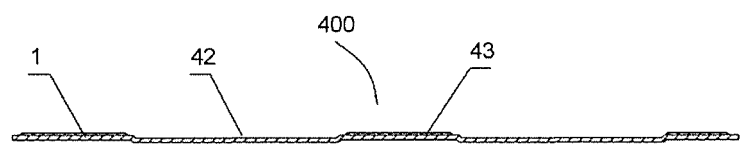
FIG. 21 is a diagram of another structure of the carrier.
Figure 22:
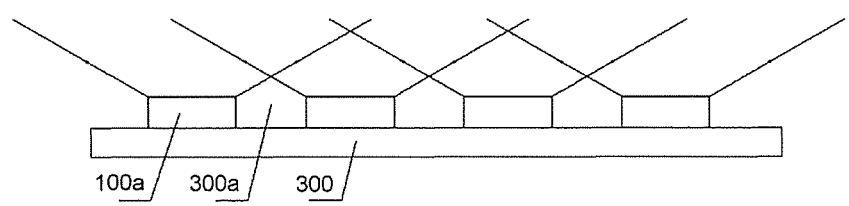
FIG. 22 is a diagram of prior art of embodiment 13 and 14.

(4) As shown in FIG. 16, injecting packaging glue 2a on the carrier 400 through various ways such as brushing or spraying, to cover the side surfaces and top surface of the flip chip body by the packaging glue 2a. As shown in FIG. 17, pressing the packaging glue 2a with a pressing plate 60, so the size of the space between the packaging glue 2a and the bottom surface of the concave cavity 42 could be controlled better, and smoothness of top surface of the packaging glue 2a and the smoothness relative to the bottom surface of the concave cavity could be improved meanwhile. In this step, there's a height difference between the bottom surface of the concave cavity 42 and a top surface of the carrier, and the packaging glue is in semi-solid state, so that it's difficult for the packaging glue to flow into the concave cavity, a space could be formed between the packaging glue 2a and the bottom of the concave cavity 42. In this embodiment, the packaging glue 2a is fluorescent glue. In order to better prevent the packaging glue from collapsing at a position corresponding to the concave cavity 42, there's a protrusion around the concave cavity on the carrier plate 1. As shown in FIG. 16 to FIG. 18, the protrusion is formed naturally through the downwards depressing of the concave cavity. As shown in FIG. 21, another protrusion could be arranged on the carrier plate.

(5) Cutting the LED packaging structure group after solidification of the packaging glue 2a into single LED packaging structures. During cutting, cutting to the isolation film with a blade. Wherein said LED packaging structure group includes a flip chip and packaging glue, and in an uncut state.

(6) As shown in FIG. 18, separating the isolating film 50 from the carrier 400.

Figure 19:
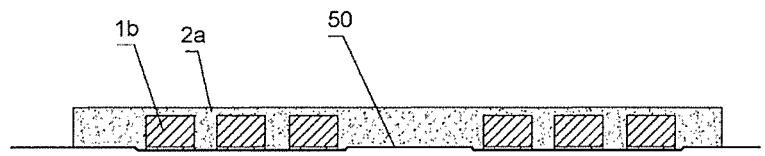
FIG. 19 is a diagram after the separation of the carrier.
Figure 20:
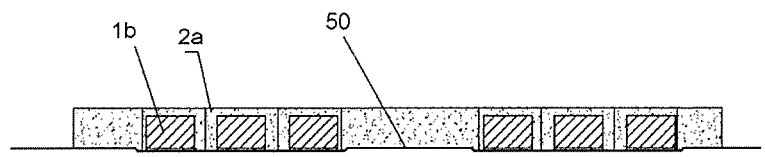
FIG. 20 is a diagram after the separation of the isolation film.

(7) As shown in FIG. 19, separating the LED packaging structure group from the isolating film 50, and forming single LED packaging structures after separating as shown in FIG. 20.

In the fabricating method of this embodiment, the concave cavity 42 is arranged on the carrier plate 1, the electrode 7 of the flip chip 1b are in the concave cavity 42 when the LED packaging structure is formed, and the electrode 7 of the flip chip 1b are contacted with the isolating film 50. As there's a height difference between the bottom of the concave cavity 42 and the top surface of the carrier plate after adding packaging glue 2a in semi-solid state, and the packaging glue 2a is in semi-solid state, the packaging glue 2a will never contact with the bottom surface of the concave cavity 42, so that a space is formed naturally between the bottom surface of the concave cavity 42 and the packaging glue 2a. The bottom surface of the packaging glue 2a would be higher than the bottom surface of the electrode 7 after the LED packaging structure group is cut to form a step between the packaging glue 2a and the electrode 7. According to the process in the present invention, because it needs only to form the concave cavity 42 on the carrier 400, lay the isolating film 50, place film chips 1b, inject glue, solidify, and cut, the process steps are very simple, the object of the present invention could be achieved meanwhile, thereby reducing the cost.

Embodiment 13

Figure 23:
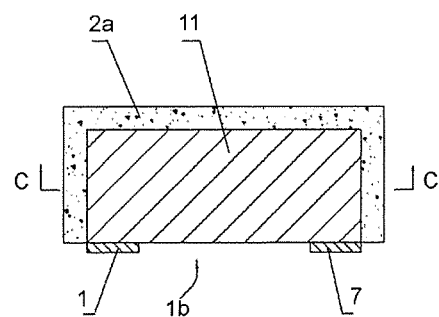
FIG. 23 is a section view of a CSP packaging structure, from three surfaces of which light could be emitted, along B-B in FIG. 28.
Figure 24:
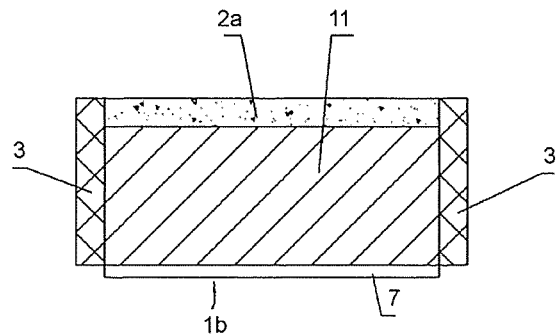
FIG. 24 is a section view of a CSP packaging structure, from three surfaces of which light could be emitted, along B-B in FIG. 28.
Figure 28:
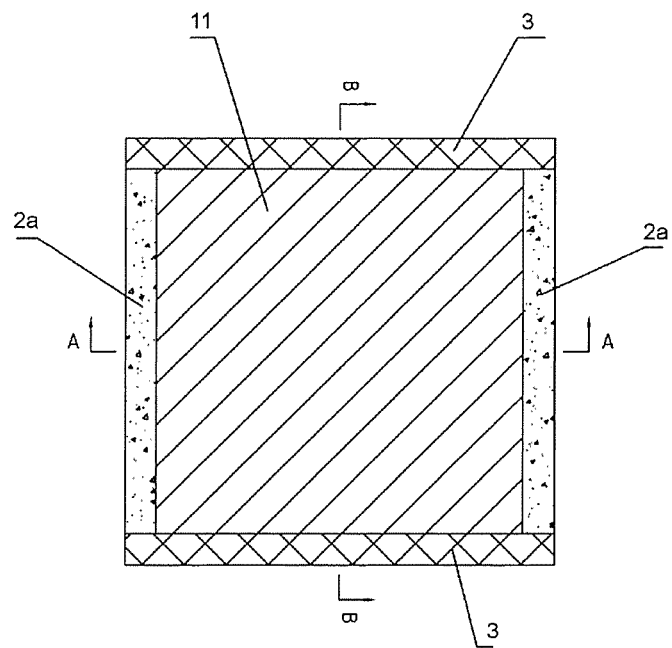
FIG. 28 is a section view along C-C in FIG. 23.

As shown in FIG. 23, FIG. 24 and FIG. 28, a CSP packaging structure, from three surfaces of which light could be emitted, includes a flip chip 1b including a flip chip body 11 and an electrode 7 arranged on the bottom of the flip chip body 11.

Two opposite side surfaces of the flip chip body 11 are packaged with light-blocking glue 3. The light-blocking glue 3 is white glue which is of less light absorption and light reflex function. The other two opposite side surfaces and the top surface of the flip chip body 11 are packaged with packaging glue 2a which is fluorescent glue.

Figure 29:
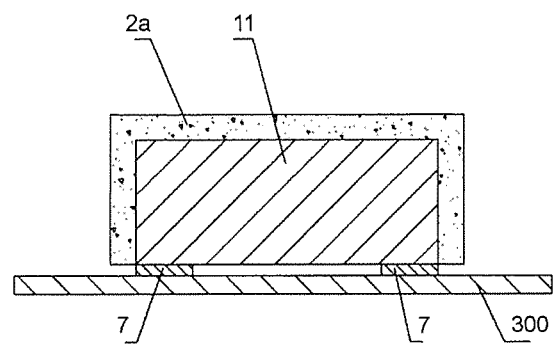
FIG. 29 is diagram of mounting a CSP packaging structure, from three surfaces of which light could be emitted, onto a substrate.

As shown in FIG. 23 and FIG. 24, the bottom surface of the packaging glue on side surfaces is higher than that of the electrode 7, and the bottom surface of the light-blocking glue 3 is higher than that of the electrode 7. As shown in FIG. 29, as the bottom surfaces of the packaging glue 2a and the light-blocking glue 3 are higher than that of the electrode 7, there will be a space between the bottom surfaces of the packaging glue 2a and the substrate 300 when the CSP packaging structure, from three surfaces of which light could be emitted, is fixed on the substrate 300. The close contact between the electrode of the flip chip 1b and the substrate 300 might not be affected, even though the packaging glue 2a and the substrate 300 have downwards burrs. Moreover, if the packaging glue 2a and the light-blocking glue 3 expand during heating, there will be a space for the expansion under the packaging glue 2a and the light-blocking glue 3. Therefore, void rate of the connection between the CSP packaging structure, from three surfaces of which light could be emitted, and the substrate 300 could be reduced, the problem that unreliable electrical connection between flip chip 1b and the substrate 300 may be caused by burrs produced by cutting of the packaging glue 2a and light-blocking glue 3, and heating during welding the electrode 7 of the flip chip and the substrate 3 may be solved, so that the connection between the flip chip 1b and the substrate 300 might be stronger.

As shown in FIG. 24, the top surface of the light-blocking glue 3 is leveled with the packaging glue on the top surface. The influence caused by the light-blocking glue 3 being higher than the packaging glue on light emitting angle could be avoided.

Figure 25:
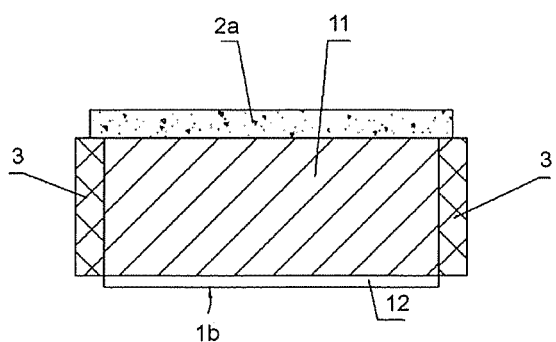
FIG. 25 is a diagram of another structure of a CSP packaging structure, from three surfaces of which light could be emitted.

As shown in FIG. 25, a part of the light-blocking glue 3 could be blocked by the packaging glue on the top surface to reduce yellow light appearing above the light-blocking glue 3.

Figure 26:
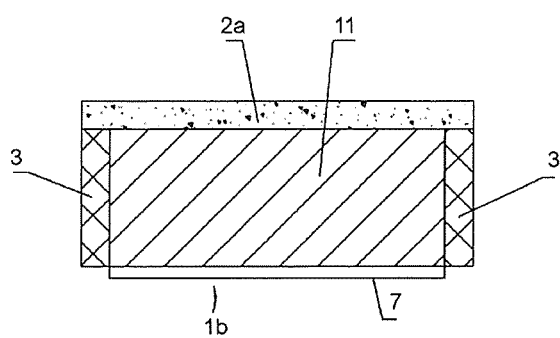
FIG. 26 is a diagram of the third structure of a CSP packaging structure, from three surfaces of which light could be emitted.

As shown in FIG. 26, all the packaging glue on the top surface could be covered on the flip chip and the light-blocking glue 3.

Figure 27:
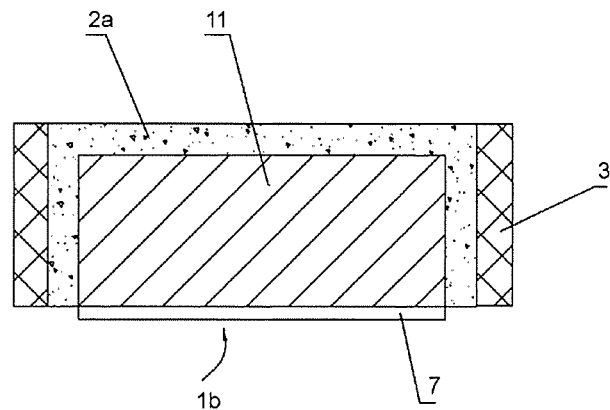
FIG. 27 is a diagram of the fourth structure of a CSP packaging structure, from three surfaces of which light could be emitted.

As shown in FIG. 27, the packaging glue 2a is arranged between the light-blocking glue 3 and the two opposite side surfaces of the flip chip 1b, the packaging glue 2a is covered on the side surfaces and top surface of the flip chip. The packaging glue 2a is arranged between the flip chip 1b and the light-blocking glue 3, so that light produced by the excitation of the packaging glue by light emitted from the side surfaces of the flip chip would be reflexed by the light-blocking glue for light-emitting, thereby improving light emitting efficiency.

In this embodiment, because of the light-blocking glue 3 arranged on the opposite side surfaces, the CSP packaging structure of this structure has only three light emitting surfaces, namely the two opposite side surfaces and the top surface, and light emitting angle of side surfaces of the flip chip 1b is big. Therefore, light emitting angle of two side surfaces having light-blocking glue 3 would be big by using the structure of the present invention, as well as the light reflex function of the light-blocking glue 3, light from the two opposite side surfaces could be reflected by the light-blocking glue 3, which causes a better uniformity of three light emitting surfaces, and range of dark area on both sides of the packaging glue 2a to be significantly reduced and light utilization to be improved.

Embodiment 14

Figure 30:
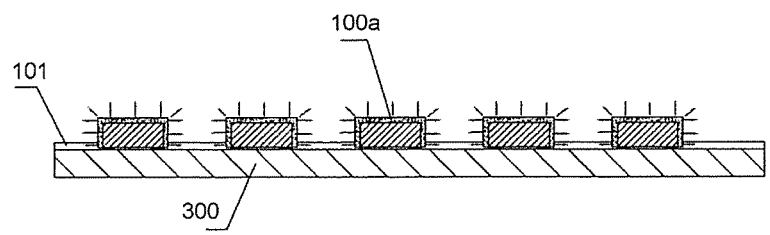
FIG. 30 is a section view along D-D of a light bar based on CPS packaging structure.
Figure 31:
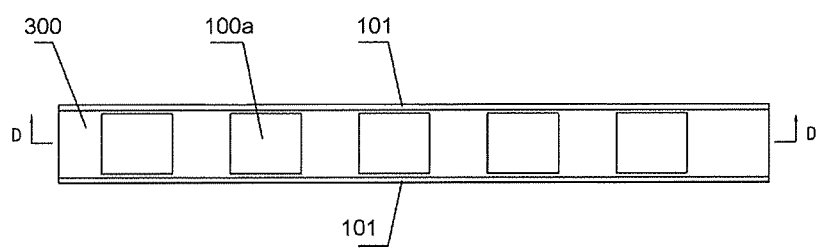
FIG. 31 is a top view of a light bar based on CPS packaging structure.

As shown in FIG. 30 and FIG. 31, a light bar 300 based on CSP packaging structure includes a substrate 300 with more than two CSP packaging structures 100a, from three surfaces of which light could be emitted, arranged thereon. A blocking bar 101 is arranged on both sides of the substrate 300. The CSP packaging structures 100a, from three surfaces of which light could be emitted, is within the blocking bar 101 to make the light emitted more concentrated and uniform.

As shown in FIG. 23, FIG. 24 and FIG. 28, the CSP packaging structure, from three surfaces of which light could be emitted, includes a flip chip 1b including a flip chip body 11 and an electrode 7 arranged on the bottom of the flip chip body 11. The electrode 7 is electrically connected to a tracing layer of the substrate.

Two opposite side surfaces of the flip chip body 11 are packaged with light-blocking glue 3. The light-blocking glue 3 is white glue which is of less light absorption and light reflex function. The other two opposite side surfaces and the top surface of the flip chip body 11 are packaged with packaging glue 2a which is fluorescent glue. The two side surfaces with packaging glue are perpendicular to the substrate 300, that is a normal direction.

As shown in FIG. 23 and FIG. 24, the bottom surface of the packaging glue on side surfaces is higher than the bottom surface of the electrode 7, and the bottom surface of the light-blocking glue 3 is higher than that of the electrode 7. As shown in FIG. 30, as the bottom surfaces of the packaging glue 2a and the light-blocking glue 3 are higher than the bottom surface of the electrode 7, there will be a space between the bottom surfaces of the packaging glue 2a and the substrate 300 when the CSP packaging structure, from three surfaces of which light could be emitted, is fixed on the substrate 300, the close contact between the electrode of the flip chip 1b and the substrate 300 might not be affected, even though the packaging glue 2a and the substrate 300 have downwards burrs. Moreover, if the packaging glue 2a and the light-blocking glue 3 expand during heating, there will be a space for the expansion under the packaging glue 2a and the substrate 300. Therefore, void rate of the connection between the CSP packaging structure, from three surfaces of which light could be emitted, and the substrate 300 could be reduced. the problem that unreliable electrical connection between flip chip 1b and the substrate 300 may be caused by burrs produced by cutting of the packaging glue 2a and light-blocking glue 3 and heating during welding the electrode 7 of the flip chip and the substrate 3 may be solved, so that the connection between the flip chip 1b and the substrate 300 might be stronger.

As shown in FIG. 24, the top surface of the light-blocking glue 3 is leveled with the packaging glue on the top surface. The influence caused by the light-blocking glue 3 being higher than the packaging glue on light emitting angle could be avoided.

As shown in FIG. 25, a part of the light-blocking glue 3 could be blocked by the packaging glue on the top surface to reduce yellow light appearing above the light-blocking glue 3.

As shown in FIG. 26, all the packaging glue on the top surface could be covered on the flip chip and the light-blocking glue 3.

As shown in FIG. 27, the packaging glue 2a is arranged between the light-blocking glue 3 and the two opposite side surfaces of the flip chip 1b, the packaging glue 2a is covered on the side surfaces and top surface of the flip chip. The packaging glue 2a is arranged between the flip chip 1b and the light-blocking glue 3, so that light produced by the excitation of the packaging glue by light emitted from the side surfaces of the flip chip would be reflexed by the light-blocking glue light, thereby improving light emitting efficiency.

In this embodiment, because of the light-blocking glue 3 arranged on the two opposite side surfaces, the CSP packaging structure of this structure has only three light emitting surfaces, namely the two opposite side surfaces and the top surface, and light emitting angle of side surfaces of the flip chip 1*b* is big. Therefore, light emitting angle of two side surfaces having light-blocking glue 3 would be big by using the structure of the present invention, as well as the light reflex function of the light-blocking glue 3, light from the two opposite side surfaces could be reflected by the light-blocking glue 3, which causes a better uniformity of three light emitting surfaces, and range of dark area on both sides of the packaging glue 2*a* to be significantly reduced and light utilization to be improved.

What is claimed is:

1. A method of packaging Chip Scale Package LED, comprising the following steps:
    (1) placing a layer of fixed film;
    (2) distributing multiple LED chips on a surface of the fixed film to form an LED chips array, wherein a space is left between adjacent two of the LED chips, and a bottom surface of each of the LED chips has an electrode and is against the fixed film;
    (3) coating a layer of fluorescent glue, the space between the adjacent two of the LED chips being fully filled with the fluorescent glue, a top surface and four side surfaces of the each of the LED chips being covered by the fluorescent glue;
    (4) after solidification of the fluorescent glue to form a fluorescent glue layer, pasting a layer of protective film on a surface of the fluorescent glue layer;
    (5) cutting at the space between the adjacent two of the LED chips and foil ling a groove between the adjacent two of the LED chips, the fluorescent glue layer and the protective film being separated by the groove, wherein the fixed film continuously extends at a bottom of the groove;
    (6) filling the groove with a light-blocking glue;
    (7) after the solidification of the light-blocking glue, cutting the light-blocking glue with a cutting depth up to the fixed film; and
    (8) separating the LED chips from the fixed film and the protective film to form single end products.

2. The method of packaging Chip Scale Package LED according to claim 1, wherein a section of the groove is square with a width of 0.3-0.5 mm.

3. A method of packaging LED, comprising the following steps:
    (1) fixing multiple LED chips on a carrier plate with a layer of fixed film to form an LED chips array;
    (2) placing a hot melt adhesive block doped with fluorescent powder on top of the LED chips array;
    (3) heating the hot melt adhesive block while applying pressure from a top of the hot melt adhesive block until the LED chips being pressed into the hot melt adhesive block, side surfaces of each of the LED chips and a reflector on a top surface of the each of the LED chips completely covered by the hot melt adhesive block; and
    (4) cutting the LED chips array with a cutting depth up to the fixed film and separating the LED chips from the fixed film to achieve single package LEDs.

4. The method of packaging LED according to claim 3, wherein the specific steps of fixing the LED chips on the carrier plate in the step (1) are as follows:
    first, pasting a layer of UV double side adhesive tape film on the carrier plate; then fixing the LED chips on the UV double side adhesive tape film, there being a space left between adjacent two of the LED chips, a bottom surface of the each of the LED chips being against the UV double side adhesive tape film.

5. The method of packaging LED according to claim 3, wherein limiting a falling depth of the hot melt adhesive block with a limiting device, so that a bottom of the hot melt adhesive block is leveled with a bottom of the each of the LED chips, an electrode exposed on the bottom of the each of the LED chips.

6. The packaging method of LED according to claim 5, wherein the limiting device is a boss arranged at side surfaces of the hot melt adhesive block, a groove is arranged on the boss, the side surfaces of the hot melt adhesive block is placed in the groove, a depth of the groove is the falling depth of the hot melt adhesive block.

7. The packaging method of LED according to claim 5, wherein the limiting device is a bump arranged on the carrier plate and between adjacent two of the LED chips, a height difference between the LED chips and the bump is the falling depth of the hot melt adhesive block.

8. A fabricating method of LED packaging structure, comprising the following steps:
    (1) providing a carrier including a carrier plate with more than one concave cavity;
    (2) laying an isolating film on the carrier, wherein the isolating film is attached to the carrier plate, a bottom surface of the concave cavity and side surfaces of the concave cavity;
    (3) fixing a flip chip on the isolating film in the concave cavity;
    (4) injecting a packaging glue on the carrier to cover side surfaces and a top surface of the flip chip; there being a height difference between the bottom surface of the concave cavity and a top surface of the carrier plate, so that a space is formed between the packaging glue and the bottom surface of the concave cavity;
    (5) cutting an LED packaging structure group after solidification of the packaging glue into single LED packaging structures;
    (6) separating the isolating film from the carrier; and
    (7) separating the LED packaging structures from the isolating film.

9. The fabricating method of LED packaging structure according to claim 8, wherein the side surfaces of the concave cavity are respectively a slope extending inwards of the concave cavity from top to bottom.

10. The fabricating method of LED packaging structure according to claim 8, wherein a protrusion is arranged around the concave cavity on the carrier plate.

11. A LED packaging structure fabricated by using the fabricating method according to claim 8, including the flip chip with an electrode arranged on a bottom of the flip chip, the packaging glue covered on side surfaces and a top surface of the flip chip, wherein a bottom surface of the packaging glue being higher than a bottom surface of the electrode.

* * * * *